(12) United States Patent
Mark

(10) Patent No.: US 9,287,646 B2
(45) Date of Patent: Mar. 15, 2016

(54) ACTIVELY COOLED ELECTRICAL CONNECTION

(75) Inventor: Gregory Thomas Mark, Cambridge, MA (US)

(73) Assignee: Gregory Thomas Mark, Somerville, MA (US)

( * ) Notice: Subject to any disclaimer, the term of this patent is extended or adjusted under 35 U.S.C. 154(b) by 344 days.

(21) Appl. No.: 13/879,227

(22) PCT Filed: Oct. 14, 2011

(86) PCT No.: PCT/US2011/056319
§ 371 (c)(1),
(2), (4) Date: Jun. 25, 2013

(87) PCT Pub. No.: WO2012/051510
PCT Pub. Date: Apr. 19, 2012

(65) Prior Publication Data
US 2013/0267115 A1 Oct. 10, 2013

Related U.S. Application Data

(60) Provisional application No. 61/393,250, filed on Oct. 14, 2010, provisional application No. 61/505,255, filed on Jul. 7, 2011, provisional application No. 61/515,487, filed on Aug. 5, 2011.

(51) Int. Cl.
*H01R 13/00* (2006.01)
(52) U.S. Cl.
CPC .............. *H01R 13/005* (2013.01); *H01R 13/00* (2013.01)
(58) Field of Classification Search
CPC .................................................... H01R 13/005
See application file for complete search history.

(56) References Cited

U.S. PATENT DOCUMENTS

| | | | |
|---|---|---|---|
| 2,510,125 A * | 6/1950 | Meakin | 174/47 |
| 3,021,380 A | 2/1962 | Barrass | |
| 3,133,145 A | 5/1964 | Bahn | |
| 3,716,652 A * | 2/1973 | Lusk et al. | 174/15.3 |
| 5,080,593 A | 1/1992 | Neumann et al. | |
| 5,229,543 A * | 7/1993 | Strefling | 174/15.6 |
| 5,616,040 A | 4/1997 | Taillon et al. | |
| 5,637,006 A * | 6/1997 | Almeras | 439/191 |
| 6,471,530 B1 | 10/2002 | Gimbatti et al. | |
| 7,303,427 B2 | 12/2007 | Swain | |
| 7,641,506 B2 | 1/2010 | Sacher et al. | |
| 8,835,782 B2 * | 9/2014 | Fischer-Carne et al. | 200/279 |
| 2006/0035488 A1 | 2/2006 | Bosco et al. | |
| 2010/0084920 A1 | 4/2010 | Banting et al. | |
| 2010/0163409 A1 | 7/2010 | Masuda et al. | |
| 2010/0193213 A1* | 8/2010 | Dung | 174/15.6 |
| 2013/0143430 A1* | 6/2013 | Sorolla Rosario et al. | 439/485 |
| 2013/0267115 A1* | 10/2013 | Mark | 439/485 |

OTHER PUBLICATIONS

Jensen et al., "Overcurrent Experiments on HTS Tape and Cable conductor," *IEEE Transactions on Applied Superconductivity* 11(1):1781-1784 (Mar. 2001).

* cited by examiner

*Primary Examiner* — James Harvey
(74) *Attorney, Agent, or Firm* — Wolf, Greenfield & Sacks, P.C.

(57) ABSTRACT

A method and electrical connection for providing electrical power is disclosed. The electrical connection comprises an electrical connector connected to an electrical conductor assembly. A current greater than a rated current capacity of at least one of the electrical connector and electrical conductor assembly may be passed through the electrical conductor assembly and electrical connector. The electrical connector and electrical conductor may be actively cooled with a flow of heat transfer medium flowing substantially along a length of the electrical conductor assembly and through the electrical connector to increase the current capacity of the electrical connection.

51 Claims, 20 Drawing Sheets

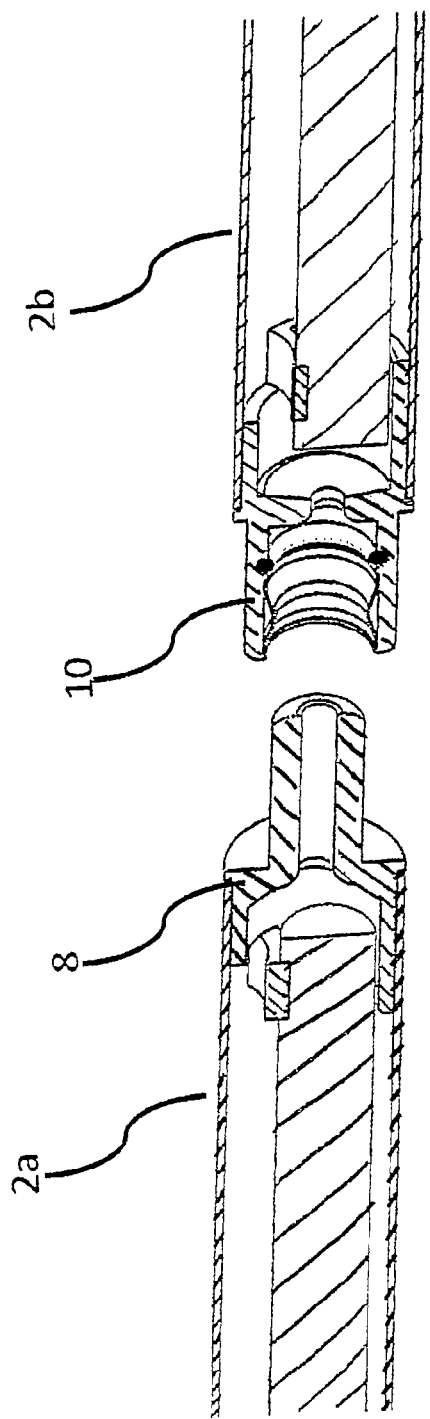
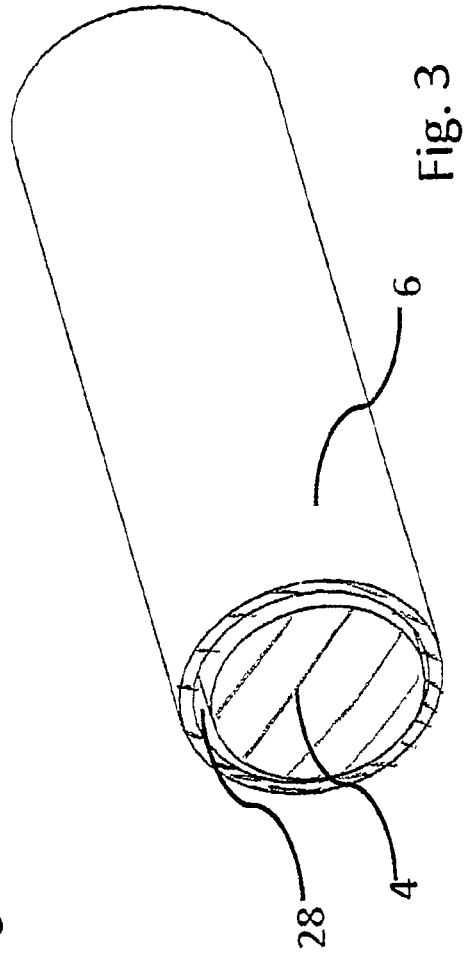

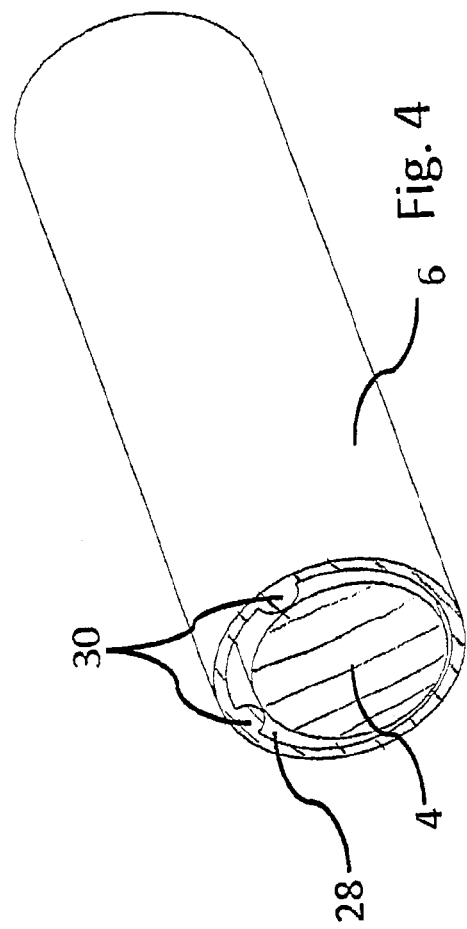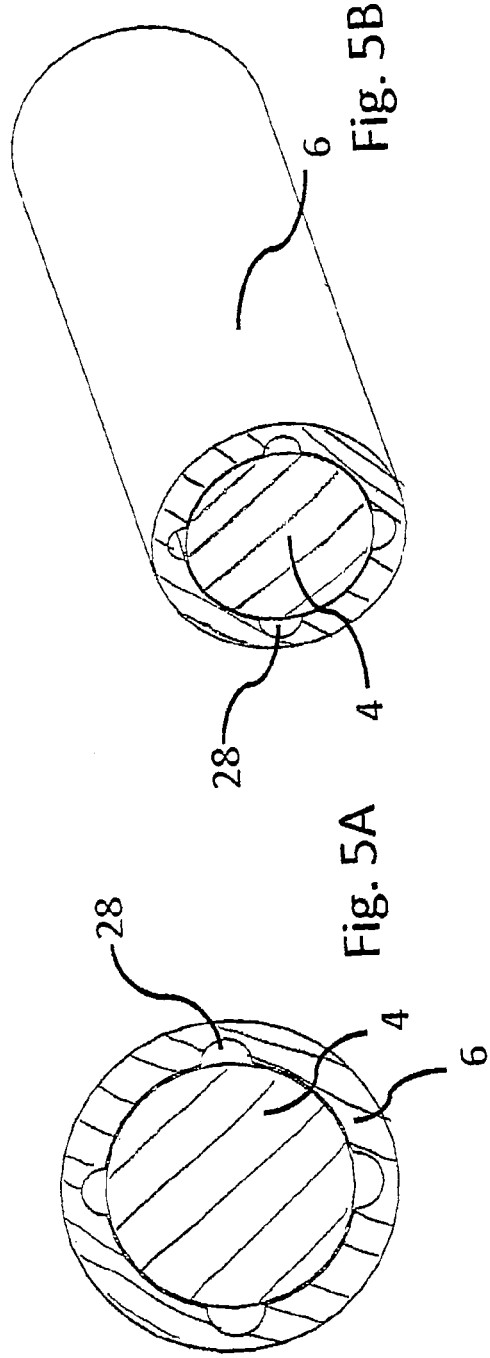

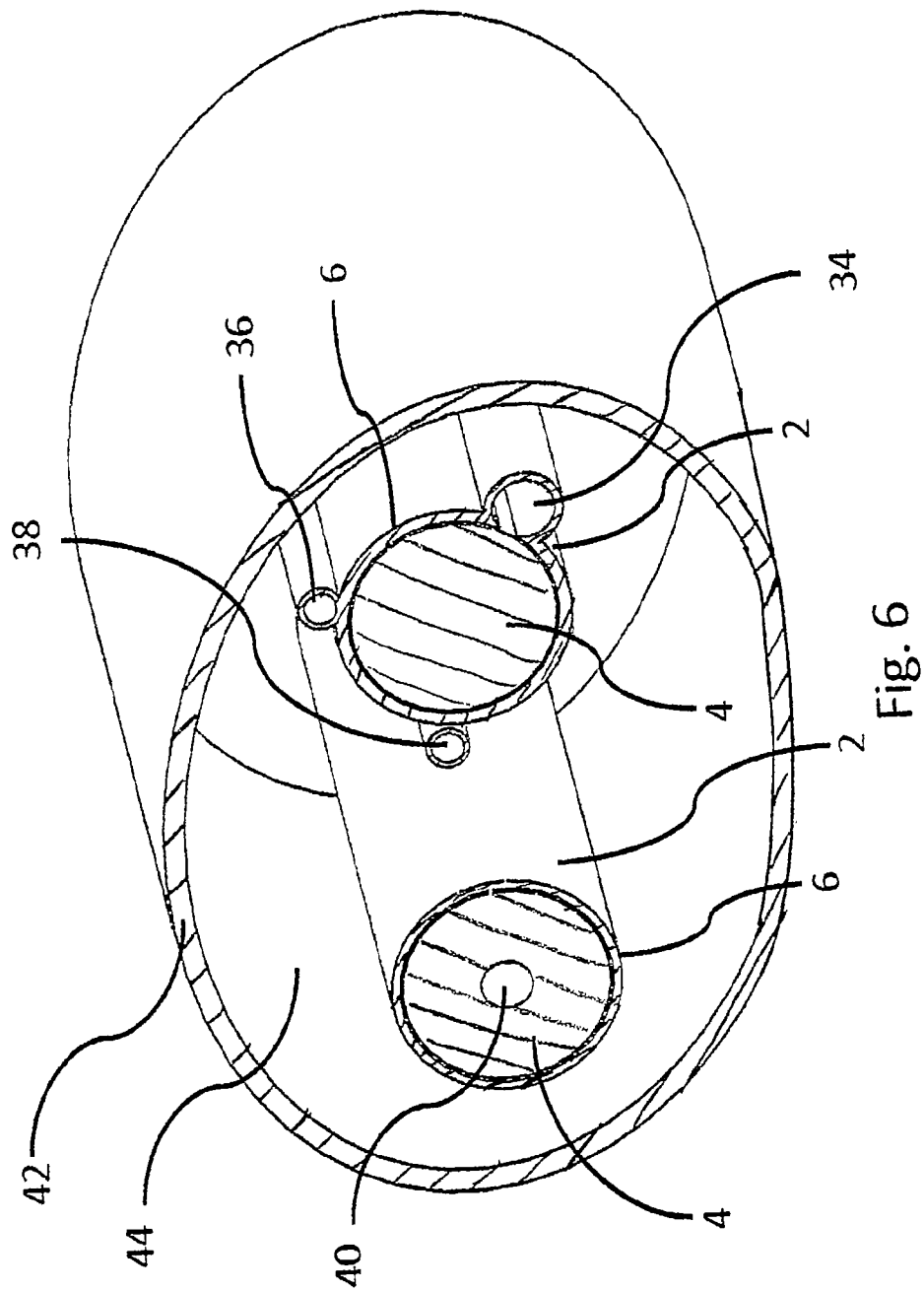

ACTIVELY COOLED ELECTRICAL CONNECTION

RELATED APPLICATIONS

This Application claims the benefit of priority under 35 U.S.C. §371(c) of International Patent Application Ser. No. PCT/US2011/056319, filed Oct. 14, 2011, which claims the benefit under 35 U.S.C. §119(e) of U.S. Provisional Application Ser. No. 61/393,250, filed on Oct. 14, 2010, U.S. Provisional Application Ser. No. 61/505,255, filed on Jul. 7, 2011, and U.S. Provisional Application Ser. No. 61/515,487, filed on Aug. 5, 2011, the disclosures of each of which are incorporated herein by reference.

FIELD

Aspects relate generally to electrical connections.

BACKGROUND

Current carrying devices, such as cables, buss bars, wires and electrical connectors generate heat as current passes through them. This resistive heating generally limits the total current carrying capabilities of a system. Indeed, the current carrying capacity of the connector, cables, and buss bars is limited by the heat that can be dissipated through natural convection of the system. For a given level of current, under the amount that will cause a thermal runaway, the system will achieve a steady state temperature during operation. In the CSA (Canadian Standards Association) standard C22.2 No. 182.3-M1987 (R2009), the current associated with a temperature rise of 30° C., during steady state operation, determines the rated current capacity of a particular connector, cable, buss bar, wire or overall system.

Connectors tend to be the hottest part of the system since it has the greatest resistance per unit length and therefore great attention and research has been spent to find solutions to reduce the resistance of the separable interface of the connector. Consequently, reducing this resistance, and therefore the internal heating of the connector, has, historically, been the primary way to increase the current carrying capability of a system.

SUMMARY

The inventor has recognized and appreciated a need for increasing the current carrying capacity of an electrical conductor and associated connectors above their present current ratings. Furthermore, the inventor has recognized that by increasing the current carrying capacity of a system, the size, weight, and material costs of the current carrying system may be reduced. Such a system is capable of being used for any number of applications, including rapid charging of rechargeable battery systems, such as cordless tools, electronic devices (e.g., computers, cell phones, tablets, etc.) and electric vehicles.

In one exemplary embodiment, a method for providing electrical power includes providing an electrical connector connected to an electrical conductor assembly. A current may be passed through the electrical conductor assembly and electrical connector that is greater than a rated current capacity of at least one of the electrical connector and electrical conductor assembly. The electrical connector and electrical conductor may be actively cooled with a flow of heat transfer medium flowing substantially along a length of the electrical conductor assembly and optionally through the electrical connector.

In another exemplary embodiment, an actively cooled electrical connection includes a first electrical conductor assembly with a first conductor assembly flow channel. The first electrical conductor assembly is attached to a first electrical connector with a first connector flow channel in fluid communication with the first conductor assembly flow channel. The connection may also include a second electrical conductor assembly with a second conductor assembly flow channel. The second electrical conductor assembly is attached to a second electrical connector with a second connector flow channel in fluid communication with the second conductor assembly flow channel. The first and second connector flow channels are adapted to direct at least one flow of heat transfer medium through the first and second conductor assembly flow channels and through the first and second connectors.

In a further exemplary embodiment, an actively cooled electrical connection includes a first electrical conductor assembly attached to a first electrical connector. The first electrical connector may include a first mating surface extending along a longitudinal direction of the first electrical connector. The connection may also include a second electrical connector including a second mating surface extending along a longitudinal direction of the second electrical connector. At least one of the first and second mating surfaces includes two or more compliant electrical contacts adapted to selectively connect the first and second electrical connectors. The first conductor assembly and the first and second electrical connector are adapted to direct at least one flow of heat transfer medium through the first conductor assembly and the first and second connectors.

In another embodiment, an electrical connector block may include a housing with a plurality of electrical connectors disposed in the housing. The block may also include at least one heat transfer medium inlet and at least one connector block flow channel disposed in the housing. The at least one connector block flow channel may be in fluid communication with the at least one inlet and may also be adapted to direct a flow of heat transfer medium through the housing.

It should be appreciated that all combinations of the foregoing concepts and additional concepts discussed in greater detail below (provided such concepts are not mutually inconsistent) are contemplated as being part of the inventive subject matter disclosed herein. In addition, all combinations of claimed subject matter are contemplated as being part of the inventive subject matter disclosed herein.

The foregoing and other aspects, embodiments, and features of the present teachings can be more fully understood from the following description in conjunction with the accompanying drawings.

BRIEF DESCRIPTION OF THE DRAWINGS

The accompanying drawings are not intended to be drawn to scale. In the drawings, each identical or nearly identical component that is illustrated in various figures may be represented by a like numeral. For purposes of clarity, not every component may be labeled in every drawing. Various embodiments of the invention will now be described, by way of example, with reference to the accompanying drawings, in which:

FIG. 2 is a schematic cross-sectional view of a disconnected actively cooled cable and connector assembly;

FIG. 3 is a schematic perspective view of a cable with the outer insulating member spaced from the inner conducting member to define a flow channel;

FIG. 4 is a schematic perspective view of a cable including an outer insulating member incorporating stand-offs;

FIG. 5A is a schematic cross-sectional view of a cable with flow channels integrally formed in the outer insulating member;

FIG. 5B is a schematic perspective view of a cable with flow channels integrally formed in the outer insulating member;

FIG. 6 is a schematic perspective view of a plurality of cable assemblies contained in an outer sheath implementing different flow channel embodiments;

DETAILED DESCRIPTION

Figure 1:
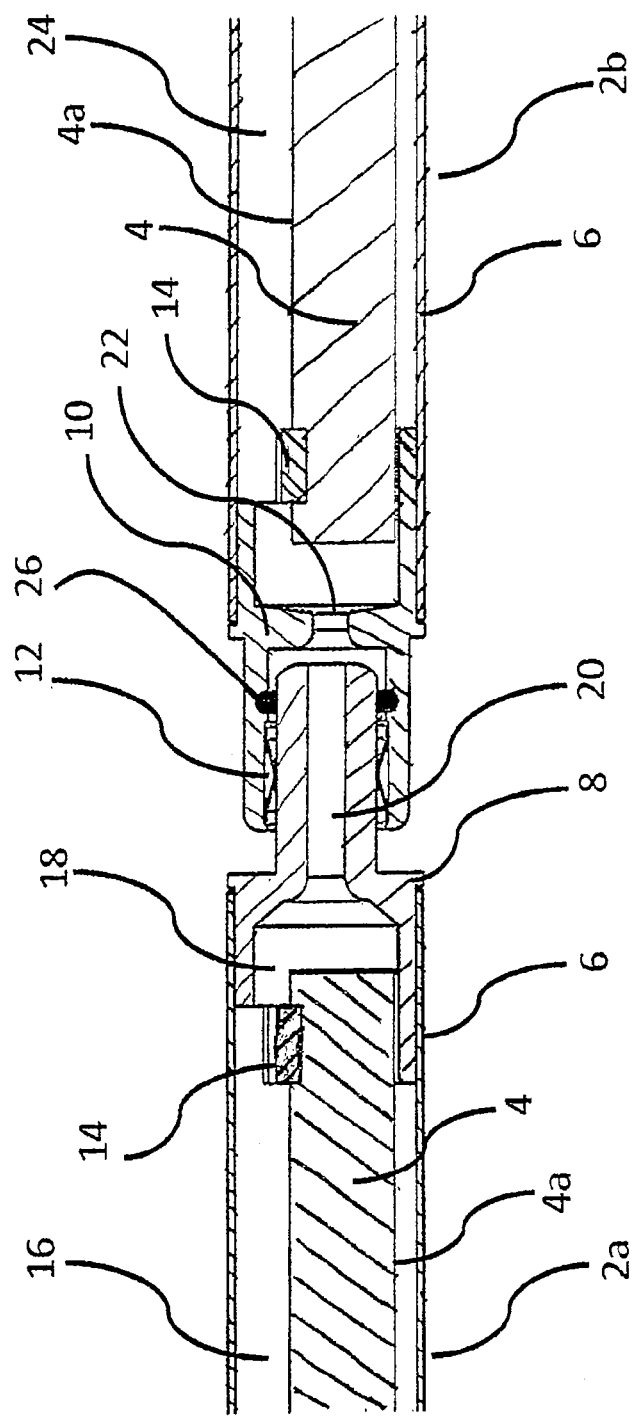
FIG. 1 is a schematic cross-sectional view of an actively cooled cable and connector assembly.

It should be understood that aspects of the invention are described herein with reference to the figures, which show illustrative embodiments in accordance with aspects of the invention. The embodiments described herein are not necessarily intended to show all aspects of the invention. It should be appreciated, then, that the various concepts and embodiments introduced above and those discussed in greater detail below may be implemented in any of numerous ways, as the disclosed concepts and embodiments are not limited to any particular manner of implementation. In addition, it should be understood that aspects of the invention may be used alone or in any suitable combination with other aspects of the invention.

The following disclosure regards an actively cooled electrical connection with an increased current carrying capacity. The increase in current carrying capacity is meant to be in relation to a "rated" current carrying capacity of similarly sized conductors and connectors, of the same interface type, without active cooling (i.e. normal conductors and connectors). The rated current carrying capacity of the similarly sized conductors and connectors may be evaluated using any one or more of the appropriate standards including, but not limited to, UL (Underwriters Laboratories) standard 1977 $2^{nd}$ edition (Jan. 24, 2011 Revision), and CSA (Canadian Standards Association) standard C22.2 No. 182.3-M1987 (R2009) both of which are incorporated by reference in their entirety. UL standard 1977 $2^{nd}$ edition (Jan. 24, 2011 Revision) is a materials based standard and CSA standard C22.2 No. 182.3-M1987 (R2009) is a temperature based standard limiting a steady state temperature rise of the system as detailed above.

An actively cooled electrical connection for use with an electrical system may include actively cooled electrical connectors and electrical conductor assemblies. The electrical conductor assemblies may include an electrical cable, buss bar, wire, or other appropriate structure adapted to conduct electricity. The active cooling may be provided by a cooling flow of heat transfer medium directed internally through the electric conductor assemblies and connectors. In some embodiments, the cooling flow of heat transfer medium may only be directed internally to the electrical conductor assemblies, in which case there is direct active cooling of the electrical conductor assemblies and indirect active cooling of the connectors from the cooled electrical conductor assemblies. In either case, active cooling may enable the overall actively cooled electrical connection to carry a current greater than the rated current capacity of either the electrical connectors, the electrical conductor assemblies, or both for a given steady state temperature rise. More specifically, either the electrical conductor assembly, the connectors, or both may carry a current greater than their respective "rated" current capacities when actively cooled. Active cooling may be provided only to the conductor assemblies and connectors. Alternatively, at least a portion of the flow of heat transfer medium may be used to cool substantially all of the components along the electrical conducting path between a power supply (e.g. a charger) and a load (e.g. a battery).

In one embodiment, the actively cooled electrical connection may include active cooling on both sides of a mating connection. The system may be actively cooled by a flow of heat transfer medium flowing interior to, and substantially along the length of, the electrical conductor assemblies and through the electrical connectors. The electrical conductor assemblies may also include at least one conductor assembly flow channel in fluid communication with a connector flow channel of an attached connector through which the flow of heat transfer medium may flow. The heat transfer medium flowing through the flow channels may exchange heat with the conductor assemblies and connectors. In one embodiment, the flow of heat transfer medium may be cooled, pressurized relative to atmospheric pressure, and/or flowed at faster rates to enhance the cooling provided to the actively cooled electrical connection and/or the electrical system.

Cooling of the actively cooled electrical connection may be controlled by a controller incorporating one or more sensors to monitor parameter(s) which may include a temperature of the conductor, a temperature of the connector, the current, a temperature of the flow, the flow rate of the flow, a temperature of a connected system, and/or a state of charge (SOC) of a connected battery. Based on the sensed parameter(s), the controller may control either the current, a temperature of the flow, a pressure of the flow, sources of additional flow, ejection of the flow at points along the path to alter relative cooling along the path, and/or a flow rate of the flow to either increase or decrease the cooling of the actively cooled electrical connection.

The above described actively cooled electrical connection may further include an actively cooled electrical connector block. The electrical connector block may include an inlet and flow channel within the housing to direct a flow of heat transfer medium through the electrical connector block. In one embodiment, the flow of heat transfer medium may be used to directly cool the electrical connector block, the connectors, or both. The heat transfer medium may be supplied by an actively cooled electrical conductor assembly and attached connector or through a separate heat transfer medium supply connection or inlet.

The heat transfer medium used for the purpose of actively cooling the systems described above may comprise: air; $CO_2$; an inert gas such as Argon, or other appropriate gas; a liquid such as water, oil, glycol, glycerin, engineered liquids, a non-electrically conductive liquid, or other appropriate liquid; or any suitable combination of the above. The heat transfer medium may preferably be non-conductive, non-corrosive, and non-reactive. The heat transfer medium may be supplied by a compressor or pump, a pressurized container, pressurized lines, or other appropriate structure or device. The supply of heat transfer medium may be integrated into, or provided separately from, a charger or system attached to the actively cooled electrical connection. The supply may provide the heat transfer medium at, below, or above ambient temperature. However, the heat transfer medium is preferably below the temperature of the actively cooled electrical connection during charging. The supply of heat transfer medium may also pressurize the heat transfer medium relative to ambient pressure to enhance heat transfer from the actively cooled electrical connection.

Turning now to the figures, several embodiments are described in more detail. For the sake of clarity, a cable having an inner conducting member and outer insulating member is depicted in the figures and is discussed in detail below. However, it would be apparent to one of skill in the art that the following disclosure is equally applicable to electrical buss bars, wires, or other appropriate structures adapted to conduct electricity. Therefore, the below discussion should not be interpreted narrowly as to only apply to cables.

In one embodiment, the electrical conductor assemblies may comprise a plurality of cables as shown in FIGS. 1 and 2. In particular, FIGS. 1 and 2 show two cables 2a and 2b. Each cable may include an inner conducting member 4 and outer insulating member 6. Furthermore, the cables 2a and 2b may be selectively connected to one another using interlocking male 8 and female connectors 10. The connectors may be pin and socket connectors as shown in FIG. 1. Alternatively the connectors may be a buss blade and receiving socket, an interposer connecting substantially parallel conducting planes, fork and blade connectors, or any other appropriate electrical connector. A plurality of compliant contacts 12 may provide a separable electrical interface between the male 8 and female connectors 10. Male 8 and female connectors 10 may also include crimp terminations 14 for attaching each connector to the associated conducting member 4. While one version of a crimp termination has been disclosed, other attachments are possible including a multi-point crimp termination, interference fit (press fit), bolt termination, solder termination, compliant press fit termination, or any other appropriate termination, as the present invention is not limited in this respect.

Cable 2a may include a flow channel 16 in fluid communication with flow channel 18 through the crimp termination 14 and flow channel 20 through the main body of male connector 8. Flow channel 18 is arranged such that crimp termination 14 does not inhibit flow from cable 2a to connector 8. Flow channel 20 may be in removable fluid communication with flow channel 22 of female connector 10 which is in fluid communication with flow channel 24 in cable 2b. Cables 2a and 2b and connectors 8 and 10 and their associated flow channels 16, 18, 20, 22, and 24 may be adapted to direct at least one flow of heat transfer medium through the interior of the cables, substantially along their lengths, and through the connectors.

A flow of heat transfer medium may be directed through the above described flow channels and structures such that it may transfer heat with the cables and connectors to maintain the actively cooled electrical connection below a predetermined temperature during the conduction of electrical power. The flow of heat transfer medium may transfer heat with each of the above noted components either directly or indirectly. The heat transfer medium may comprise: air; $CO_2$; an inert gas such as Argon, or other appropriate gas; a liquid such as water (including deionized or distilled water), oil, glycol, glycerin, engineered liquids, a non-electrically conductive liquid, or other appropriate liquid; or any suitable combination of the above. The heat transfer medium may preferably be non-conductive, non-corrosive, and non-reactive. The heat transfer medium may be at, below or above ambient temperature. However, the heat transfer medium is preferably below the temperature of the inner conducting members 4 during charging. The heat transfer medium may be provided with a minimum flow rate of approximately 30 cfm, 40 cfm, 50 cfm, 60 cfm, or 70 cfm. Other appropriate flow rates may be employed. The heat transfer medium may also be pressurized relative to ambient pressure to enhance heat transfer from inner conducting members 4. The heat transfer medium may be pressurized between approximately 10 psi and 120 psi. In some high pressure applications, the heat transfer medium may be pressurized to a pressure greater than 120 psi. The pressure may be controlled by the use of a regulator valve to start, stop, or throttle the pressure of the flow of heat transfer medium. The regulator valve may be disposed in the actively cooled electrical connection, charger, or another system placed in fluid communication with the actively cooled electrical connection. The pressure may also be controlled using a restrictor placed downstream from the actively cooled electrical connection.

In some embodiments, inner conducting members 4 may include a layer 4a disposed thereon and extending the length of the inner conducting members 4. Layer 4a may be a shielding layer, insulating layer, plating layer, surface treatment, or a combination thereof. Alternatively, a shielding layer and insulating layer may be applied to the inner conducting members 4 as two separate structures. When layer 4a includes a shielding layer, plating layer, or surface treatment, it may be adapted to substantially protect the inner conducting members 4 from the oxidative or corrosive effects of the flow of heat transfer medium. The shielding layer may be made from a polymer, metal, metal cladding, metal plating, metal wrap, surface treatment (such as polishing, painting, powder coating), and/or another appropriate material or composite material. When layer 4a includes an insulating layer, it may insulate at least a portion of the inner conducting member from the flow of heat transfer medium.

The system may also include an O-ring 26, or alternatively a gasket, to either partially or completely seal the system with respect to the heat transfer medium. As depicted in FIG. 1, the O-ring may be recessed in a groove on female connector 10. During the mating process, the male pin of connector 8 may slide through the conductive contact points 12 of female connector 10. The male pin may continue to travel in the mating direction to engage the O-ring and seal the system. While a peripheral O-ring seal has been shown in FIG. 1, other sealing types and locations, including high pressure seals with an associated retaining system, have been contemplated as well. Any suitable shape and/or material may be employed for the seal ring, as the current disclosure is not limited in this respect.

As shown in more detail in FIGS. 3-6, the flow channels in cables 2a and 2b may either be formed between, interior to, or even separate from inner conducting member 4 and outer insulating member 6.

In one embodiment, as shown in FIG. 3, outer insulating member 6 may have a larger inner diameter than an outer diameter of inner conducting member 4 such that a portion of the outer insulating member is spaced from the at least one inner conducting member. The space between the inner conducting member and outer insulating member may define at least one of the conductor flow channels.

As shown in FIG. 4, the cable may further include standoffs 30 between inner conducting member 4 and outer insulating member 6. Standoffs 30 may either be integrally formed in inner conducting member 4 or outer insulating member 6. Alternatively, standoffs 30 may be a separate structure that is inserted, or bonded, between the inner conducting member 4 and outer insulating member 6. Without wishing to be bound by theory, standoffs 30 may hold inner conducting member 4 in place with respect to outer conducting member 6, which may result in less drag as compared to the embodiment detailed with respect to FIG. 3 in which the inner conducting member 4 may be free to move relative to the outer insulating member 6.

In another embodiment, as shown in FIGS. 5a and 5b, a flow channel 28 may be integrally formed on the inner surface of outer insulating member 6 adjacent to inner conducting member 4. In addition, outer insulating member 6 may either have a single, or a plurality of, flow channels 28 integrally formed therein. Alternatively, flow channels 28 may be integrally formed on the outer surface of inner conducting member 4. Flow channels 28 may be straight along the length of the cable, or they may be helically arranged along the length of the cable. The number of coils of flow channels 28 per inch may vary along the length of inner conducting member 4. The number of coils per inch may increase along the length of inner conducting member 4. In addition to the above, the flow channels 28 may vary in size, shape, and/or the contact area with the inner conducting member 4 along the length of the cable. In some embodiments, flow channels 28 may comprise a separate tube. The tube may be have a flattened surface in contact with inner conducting member 4 to increase a contact area between them. Without wishing to be bound by theory, the above detailed flow channel arrangements may provide a more uniform temperature profile along the length of the cable.

Multiple embodiments of flow channels are depicted in FIG. 6. Similar to the embodiment depicted in FIGS. 5a and 5b, a partially detached flow channel 34 may be integrally formed on the inner surface of outer insulating member 6, or in the outer surface of inner conducting member 6. Flow channel 34 may still directly cool inner conducting member 4, but possibly not as much as the embodiment shown in FIGS. 5a and 5b for a given flow rate and temperature of heat transfer medium. Alternatively, flow channel 36 may be disposed on the exterior surface of, or formed in the interior of, outer insulating member 6. The resulting heat transfer between flow channel 36 and inner conducting member 4 would be through at least a portion of outer insulating member 6. In yet another embodiment, a flow channel 38 may be removed from the cables 2. Flow channel 38 may run substantially parallel to the cables 2 and may indirectly transfer heat with the cables 2. Flow channels 34, 36, and 38 may be straight along the length of the cables 2, or they may be helically arranged along the length of the cables 2. Without wishing to be bound by theory, helically arranging the flow channels along the length of the cables 2 may provide a more uniform temperature profile for the cables 2. The cables 2 may also include a flow channel 40 disposed within, and running substantially the length of, the inner conducting element 4. Alternatively, the electrical system may include a plurality of cables 2 housed within a single outer sheath 42 running for substantially the entire length of the cables 2. The gaps between sheath 42 and the outer insulating member 6 of each cable 2 could define a flow channel 44 through which a flow of heat transfer medium may flow to cool substantially all of the cables 2 contained therein. While multiple cooling arrangements are depicted in FIG. 6, and detailed above, it should be understood that an actively cooled electrical connection may implement any of the above noted cooling methods individually, or in combination, as the current disclosure is not limited in this regard.

Figure 7:
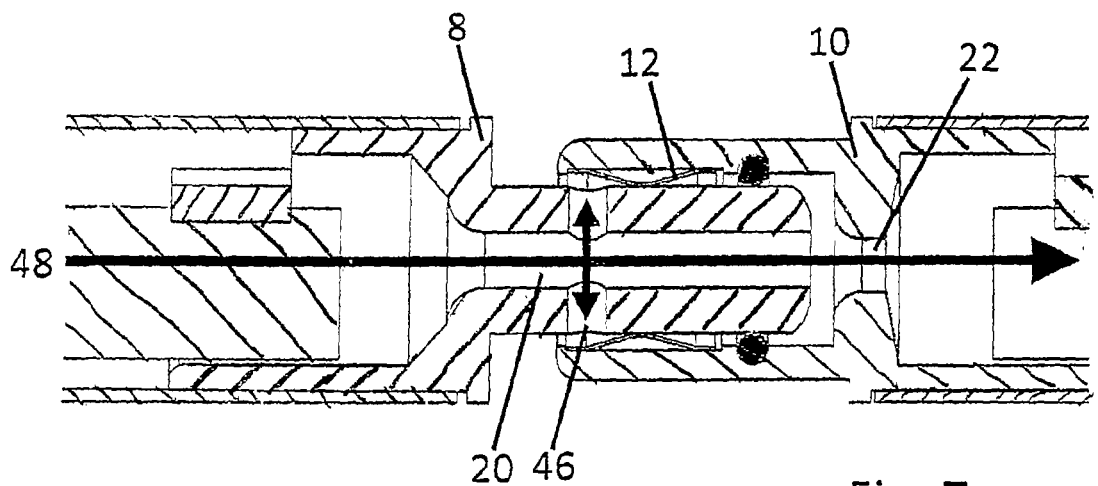
FIG. 7 is a schematic cross-sectional view of a cable and connector assembly showing cooling flow at the connector interface.

For certain high current applications the connectors may include direct cooling of the separable interface. In one embodiment, as shown in FIG. 7, flow channels, such as radial flow channel 46, direct at least a portion of a flow of heat transfer medium 48 routed through flow channel 20 to directly cool the separable interface, e.g., the compliant electrical contacts 12. In some embodiments, substantially all of the flow of heat transfer medium 48 may be directed through radial flow channels 46 prior to being directed to flow channel 22 in the mating connector. Alternatively, the flow of heat transfer medium may be vented after flowing through radial flow channels 44.

Figure 8:
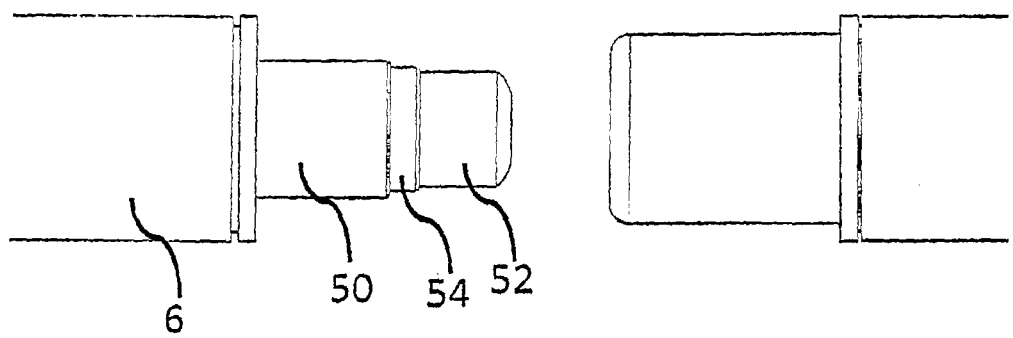
FIG. 8 is a schematic view of a cable and connector assembly incorporating two or more conductors into a single plug.

In addition to the above, it may be desirable to include a multiple conductor connector capable of connecting a plurality of conductor assemblies to minimize the number of individual plug connections as shown in FIG. 8. The connector may include at least first and second electrical contact elements 50 and 52. The first and second electrical contact elements 50 and 52 may be separated by insulation 54 disposed between the first and second electrical contact elements 50 and 52. The connector may also include flow channels adapted to pass a flow of heat transfer medium through the connector. The flow channels may be disposed interior to, or between, the first electrical contact element 50, the second electrical contact element 52, and/or the insulation 54. In other embodiments, the flow channels may be separate from the first electrical contact element 50, the second electrical contact element 52, and the insulation 54.

Without wishing to be bound by theory, the heat transfer medium may increase in temperature as it flows downstream through the above described actively cooled electrical connection due to the exchange of heat with the inner conducting member. Consequently, the temperature of the flow of heat transfer medium may be coolest near its inlet and hottest near its outlet. Due to the difference in the temperature of flow of heat transfer medium, the cable may develop a temperature gradient along its length, wherein the upstream portion may be cooler than a corresponding warmer downstream portion. Specific strategies to mitigate the noted temperature gradient are detailed below.

As detailed above in regards to FIG. 1, layer 4*a* may act include an insulating layer disposed on, and extending the length of, inner conducting member 4. In addition to the above, the insulating layer may include an insulation gradient such that an upstream portion of the inner conducting member 4, adjacent to a cooler flow of heat transfer medium, may be insulated to a greater degree than a downstream portion, adjacent to a warmer flow of heat transfer medium. Without wishing to be bound by theory, by insulating the upstream portion of inner conducting member 4 to a greater degree than a downstream portion, the relative heat transfer between the two portions and the flow of heat transfer medium may be substantially balanced along the length of inner conducting member 4. Consequently, the temperature gradient across inner conducting member 4 may be reduced.

In addition to the above, flow channels 16 and 24 of conductor assemblies 2*a* and 2*b* may have cross sectional areas that vary along their length. Flow channels 16 and 24 may have smaller cross sectional areas at an upstream portion corresponding to a cooler flow of heat transfer medium. In one embodiment, cables 2*a* and 2*b* may include flow channels 16 and 24, that gradually increase in cross-sectional area from the upstream to downstream ends of the cables 2*a* and 2*b*. More generally, the cross sectional area of a first portion of flow channels 16 and 24, corresponding to a cooler flow of heat transfer medium, may be decreased in comparison to the cross sectional area of a second portion of flow channels 16 and 24, corresponding to a warmer flow of heat transfer medium. Without wishing to be bound by theory, a decreased cross sectional area of flow channels 16 and 24 may result in an increase in the flow rate of the heat transfer medium, which may result in a corresponding decrease in the heat transfer efficiency between the flow of heat transfer medium and the portion of inner conducting member 4 corresponding to that location. By decreasing the heat transfer efficiency between the inner conductor member 4 and cooler portions of the flow of heat transfer medium, the relative heat transfer between the inner conducting member 4 and the flow of heat transfer medium may be substantially balanced along the length of inner conducting member 4. Consequently, the temperature gradient across inner conducting member 4 may be reduced.

In addition to altering the insulating properties of the cables and flow characteristics of the heat transfer medium, the temperature gradient of the cables may also be managed by how the flow is directed through the cables and associated connectors. Several possible flow configurations are discussed in detail below. However, any number of different configurations to help mitigate temperature differences in the cables would be apparent to one of skill in the art. Therefore, the below described flow configurations are not meant to limit how the flow may be routed, and instead should be interpreted as generally disclosing directing a flow of heat transfer medium through the cables and associated connectors in such a way as to mitigate the temperature differences along the length of the actively cooled electrical connection.

Figure 9:
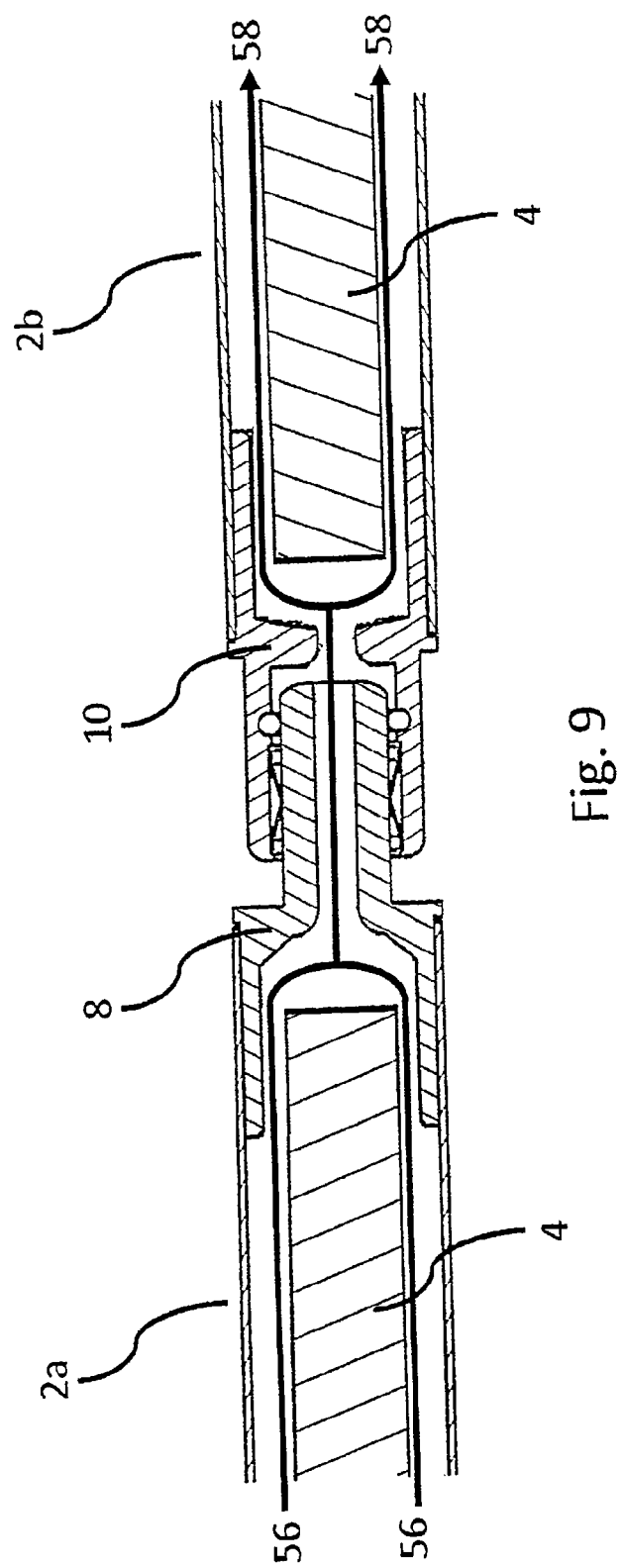
FIG. 9 is a schematic cross-sectional view of a cable and connector assembly implementing a straight through flow path.

In one configuration, the actively cooled electrical connection may be adapted such that a flow of heat transfer medium, indicated by the arrow, enters the connection at inlet 56 and flows along the length of a first cable 2*a*, through the associated connectors 8 and 10, and along the length of an attached second cable 2*b*, to exit the actively cooled electrical connection at outlet 58. As detailed above, the flow of heat transfer medium may warm as it flows through the actively cooled electrical connection. Without wishing to be bound by theory, the configuration depicted in FIG. 9 is a straight flow through arrangement which may result in the coolest portion of the actively cooled electrical connection being adjacent to inlet 56 and the warmest portion of the actively cooled electrical connection being located adjacent to outlet 58.

In another configuration, a flow of heat transfer medium, indicated by the arrow, enters the connection at inlet 60*a* and flows along the length of cable 2*a* in a first direction prior to reversing direction. Once reversed in direction, the flow of heat transfer medium may flow along the length of cable 2*a* in a second direction substantially opposite that of the first and may exit the actively cooled electrical connection at outlet 62*a* which may be near inlet 60*a*. Due to the reversal in direction, the warmer downstream flow may be superimposed with the cooler upstream flow of heat transfer medium along the length of the cable. Without wishing to be bound by theory, it is believed the superposition of the warmer and cooler portions of the flow along the length of the cable may help to mitigate temperature gradients along the cable length. Such an arrangement may be implemented on both sides of the connection so as to cool substantially the entire conducting path as indicated by separate inlet 60*b* and outlet 62*b* depicted in FIG. 10. While FIG. 10 discloses separate flows on either side of the connectors, it is possible to allow a single flow of heat transfer medium to flow through the cables and connectors prior to reversing the direction of the flow to flow back through the cables and connectors in the opposite direction.

Figure 11:
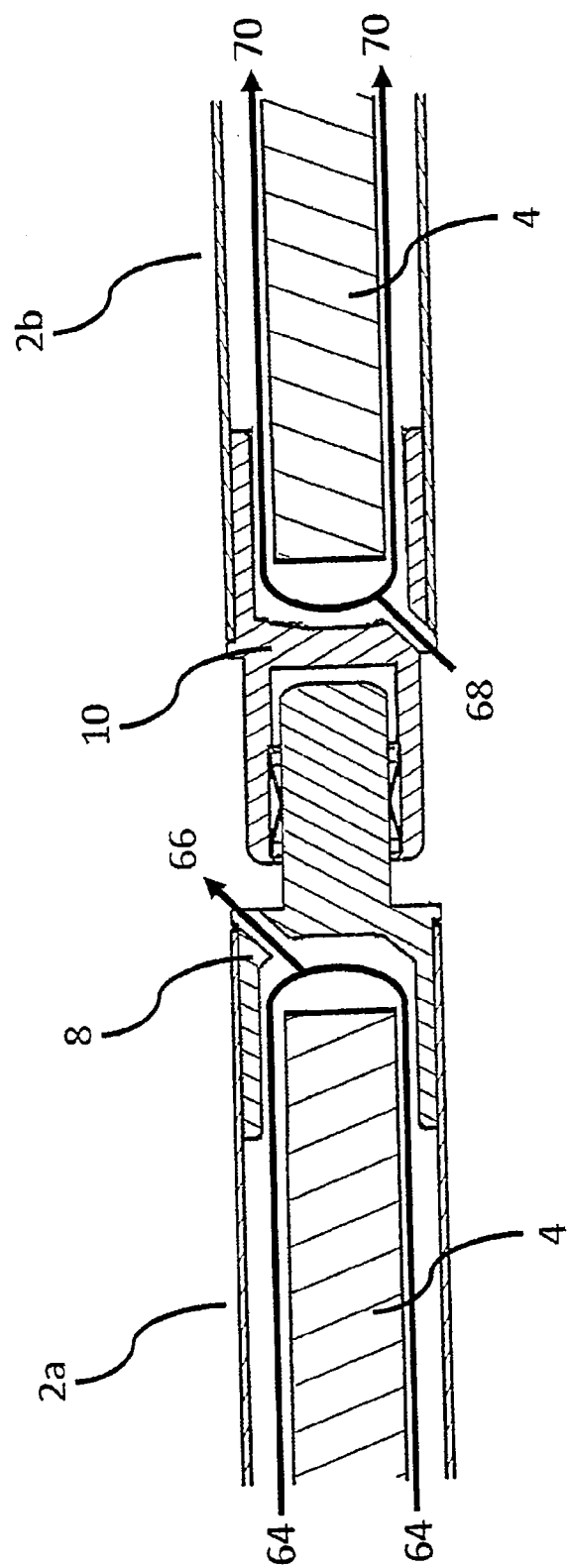
FIG. 11 is a schematic cross-sectional view of a cable and connector assembly implementing separate flows on either side of the connectors.

In addition to the above, cables located on either side of an electrical connection may be adapted and arranged to accept separate flows of heat transfer medium, indicated by the arrows, that either enter or exit the cables through the connectors, or substantially adjacent the connectors. In one embodiment, as depicted in FIG. 11, the flow of heat transfer medium entering inlet 64 may flow through cable 2*a* and exit through connector 8 at outlet 66. Similarly, the flow of heat transfer medium entering inlet 68 may flow through connector 10 into cable 2*b* and exits cable 2*b* at an outlet 70. The resulting separate flow paths are shorter than a single flow path extending the length of the cables. Without wishing to be bound by theory, the above arrangement may reduce the temperature gradient along cables 2*a* and 2*b*, as compared to the embodiment depicted in FIG. 9, due to the smaller temperature difference of the flow of heat transfer medium along the two shorter flow paths. While a flow has been depicted as entering cable 2*a* at 64, it is possible that a flow of heat transfer medium could flow in the opposite direction from 66 to 64. Similarly, The flow through cable 2*b* could proceed from 70 to 68. Furthermore, the direction of flow on either side of the connectors may be in the same, or opposite, directions as the current disclosure is not limited in this fashion.

Figure 12:
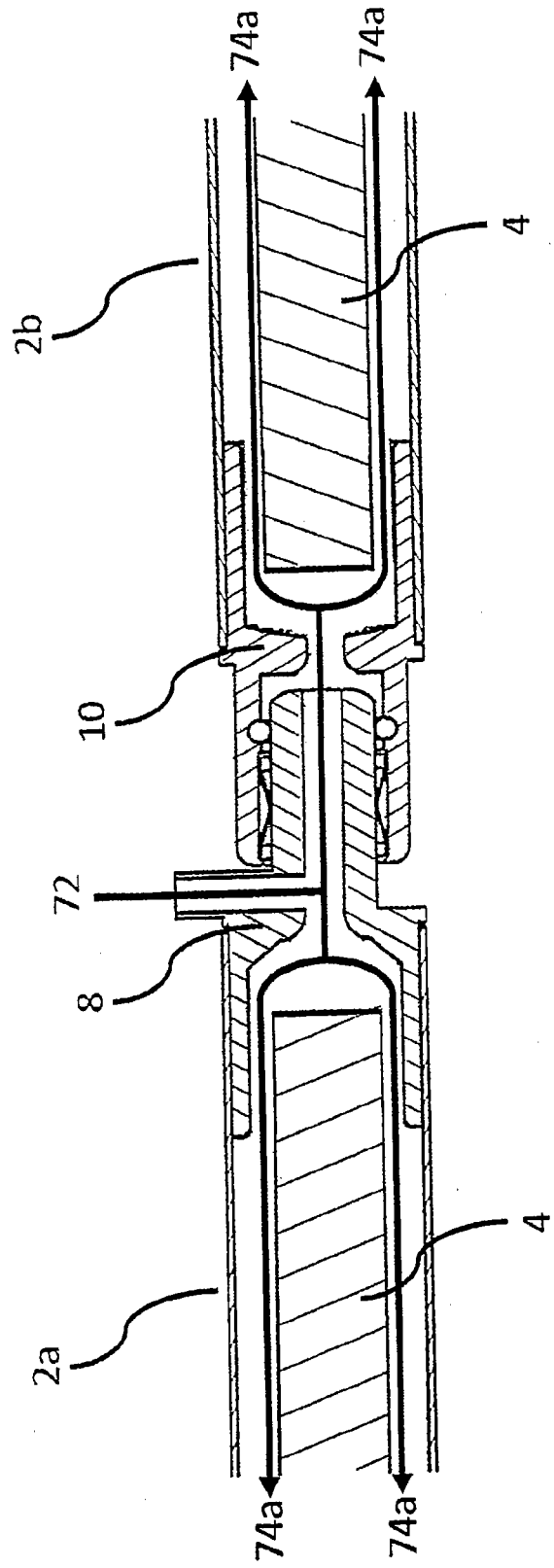
FIG. 12 is a schematic cross-sectional view of a cable and connector assembly implementing a flow input at the connectors.

In another configuration, a flow of heat transfer medium, indicated by the arrows, enters at an inlet 72 incorporated into connectors 8 and 10, as shown in FIG. 12. While the depicted inlet is disposed on a single connector that is in fluid communication with the other connector and cables 2a and 2b, it is possible that each connector may include a separate inlet. In addition, connectors 8 and 10 may include separate structures that cooperate to form an inlet in fluid communication with the cables 2a and 2b and the connector flow channels when the connectors are in the mated state. Inlet 72 may also be arranged in such a manner that it could create an alignment and/or locking feature between the two mating connectors. For example, inlet 72 could extend outwards from male connection 8 and could be inserted into a groove in female connector 10 that could include a locking feature. The locking feature could include an interference retention system, a twist lock system, or any other appropriate locking mechanism. In contrast to the above, the inlet 72 may be located on a part of either connector 8 or 10 such that the connection is removed from the connection interface and thus avoiding any interference issues with the mating connection. Regardless of the particular inlet location and structure, after entering the connectors, the flow of heat transfer medium may be redirected to flow through both cables 2a and 2b. The flow through each cable may be balanced so as to be substantially the same. The now separate flows of heat transfer medium may then exit cables 2a and 2b at separate outlets 74a and 74b. Without wishing to be bound by theory, the above arrangement, similar to the embodiment depicted in FIG. 11, may reduce the temperature gradient along cables 2a and 2b due to the smaller temperature difference of the flow of heat transfer medium along the two shorter flow paths.

Figure 13:
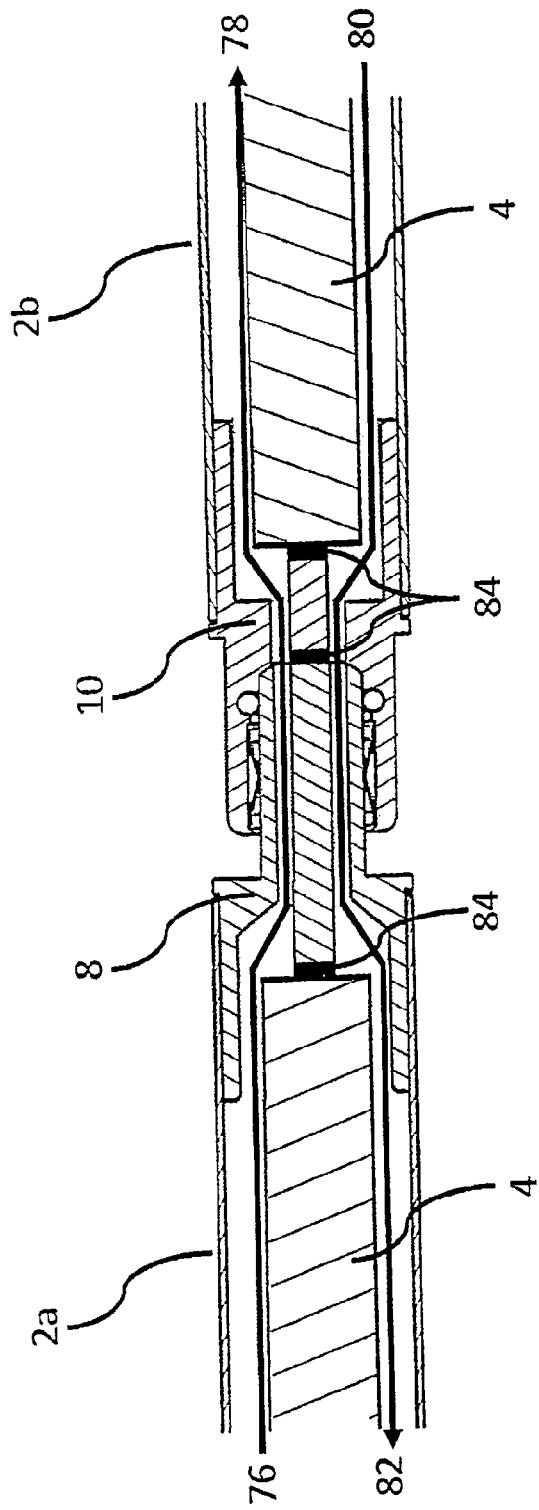
FIG. 13 is a schematic cross-sectional view of a cable and connector assembly implementing separate flows flowing through the cables and connectors in opposite directions.
Figure 13A:
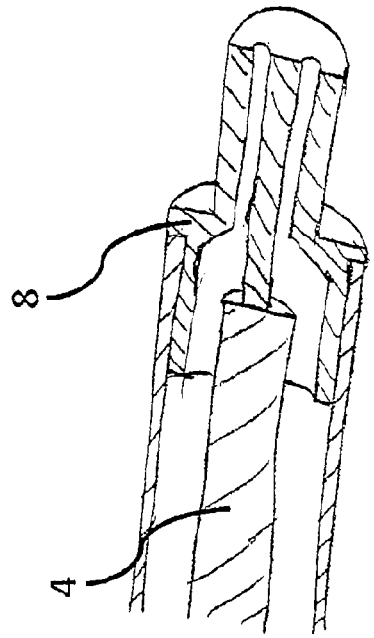
FIG. 13A is a schematic cross-sectional view of a cable and connector assembly with two separate flow channels corresponding to FIG. 13.

In yet another configuration, separate first and second flows of heat transfer medium, indicated by the arrows, may enter at inlets 76 and 80, as shown in FIG. 13, located on opposite distal ends of connected cables 2a and 2b. The separate flows of heat transfer medium may flow along separate flow channels through each cable and connector in substantially opposite directions and exit at outlets 80 and 82 respectively which may be located at opposite distal ends of the cables 2a and 2b. Gaskets 84 be located between the mating connectors 8 and 10, and between the connectors 8 and 10 and the inner conducting elements 4. Gaskets 84 may provide a seal between the separate components to avoid leakage between the flow channels present in the cables and connectors. While a gasket has been shown any appropriate sealing method may be used including, but not limited to, an O-ring, weld, polymer seal, deformable metal seal, and/or a brazed connection. A perspective view of the separate flow channels present in connector 8 are illustrated in FIG. 13A. The depicted flow channels in connector 8 are in fluid communication with separate flow channels in the cable 2a and mating connector 10. As discussed above, a flow of heat transfer medium may warm as it flows through the assembly. However, in the current configuration, the coldest portion of one flow may be substantially superimposed with the hottest portion of the flow directed in the opposite direction. Thus, similar to the embodiment shown in FIG. 10, the superposition of the hottest and coldest portions of the separate flows may help to mitigate temperature gradients along the cable lengths.

Figure 10:
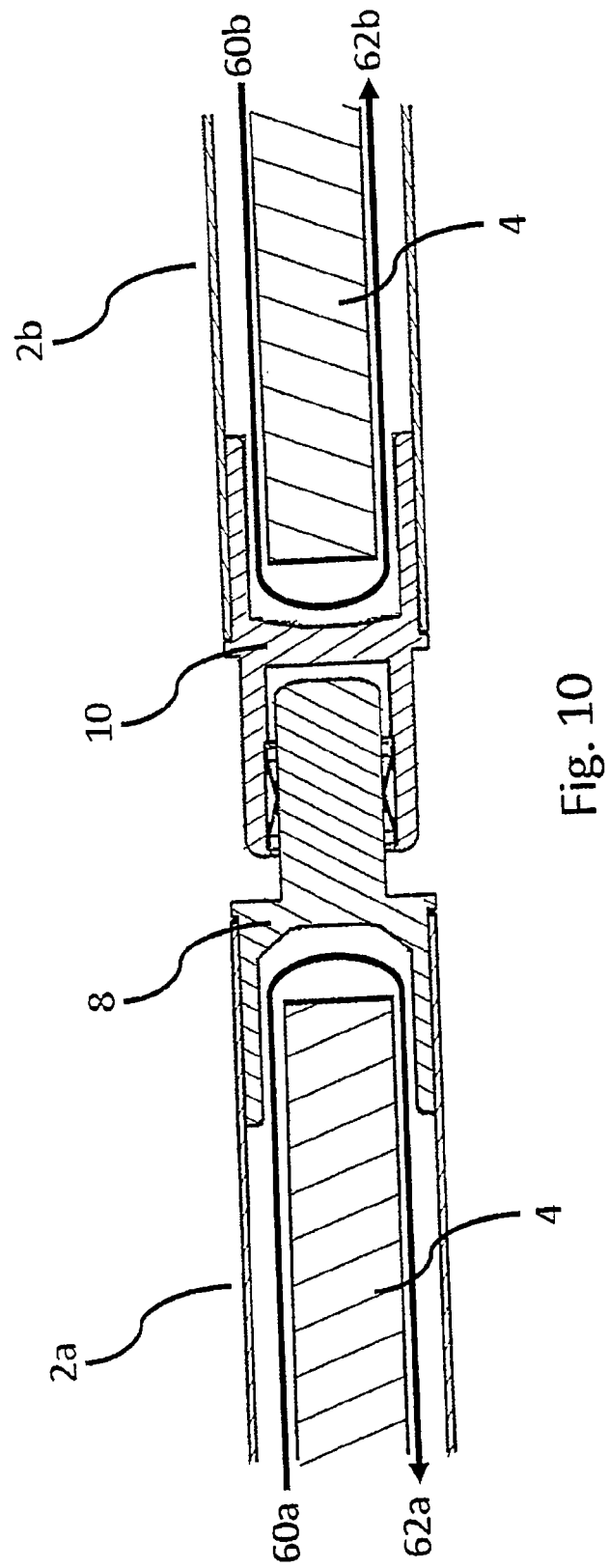
FIG. 10 is a schematic cross-sectional view of a cable and connector assembly implementing separate flows that reverse in direction.
Figure 14:
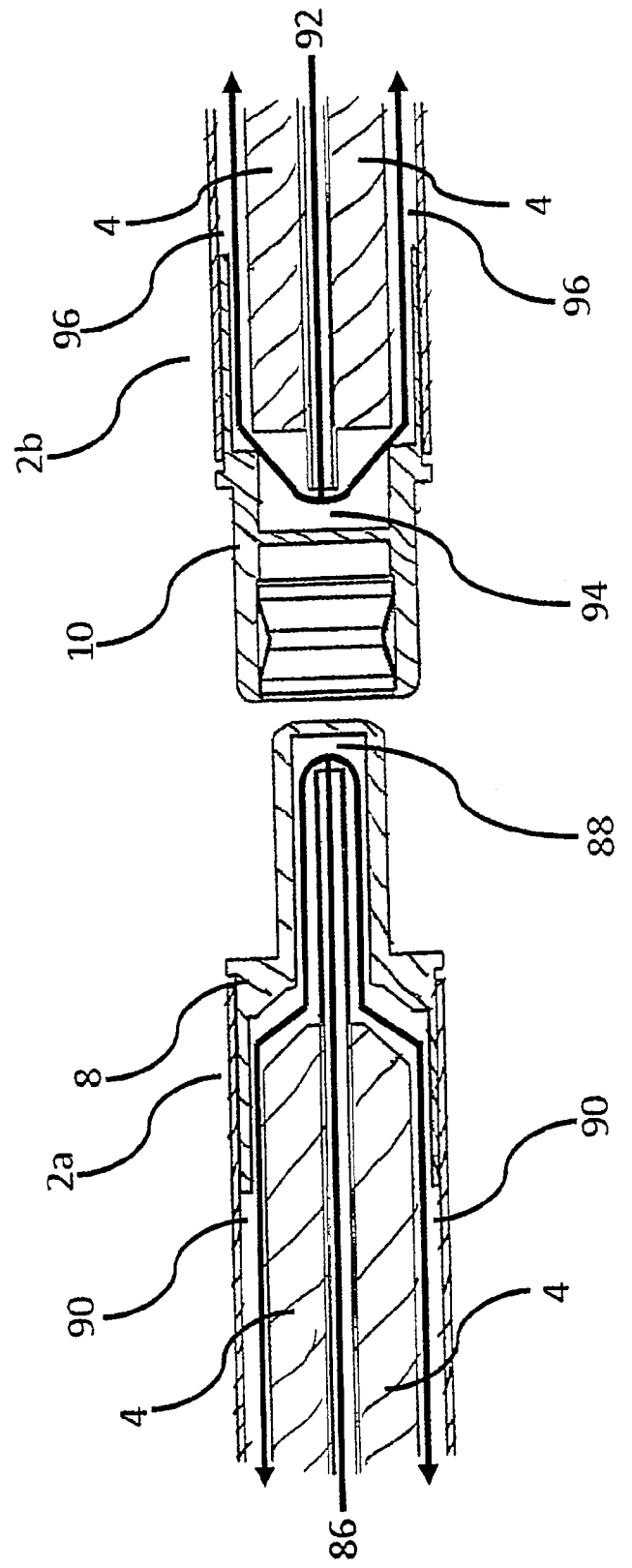
FIG. 14 is a schematic cross-sectional view of a specific embodiment of a cable and connector assembly implementing separate flows that reverse in direction.

FIG. 14 shows a specific embodiment of the flow depicted in FIG. 10 implementing a reversal in direction of the flow. The assembly again includes cables 2a and 2b selectively attachable through connectors 8 and 10. Cable 2a may further include a flow channel 86 located in the center of inner conducting member 4. Flow channel 86 may be adapted to direct a flow of heat transfer medium, depicted by the arrows, substantially along the length of cable 2a, and through the interior of inner conducting member 4, to connector 8. Attached connector 8 may include an internal structure 88 adapted to redirect the flow of heat transfer medium substantially in the opposite direction along the length of cable 2a and into flow channel 90 located along the periphery of cable 2a. Thus, the flow initially flows down the cable through the interior of inner conducting member 4 prior to being redirected in the opposite direction through the outer flow channel. Similarly, cable 2b includes a flow channel 92 located in the center of inner conducting member 4. Flow channel 92 may be adapted to direct a separate flow of heat transfer medium substantially along the length of cable 2b and through the interior of inner conducting member 4 to connector 10. Attached connector 10 may also include an internal structure 94 adapted to redirect the flow of heat transfer medium substantially in the opposite direction along the length of cable 2b and into flow channel 96 located along the periphery of cable 2b. Thus, cooling may be provided to both sides of the connection. Also as described above, the separate flows of heat transfer medium may instead be a single flow that flows through the connectors prior to reversing direction such that both cables and their associated connectors are cooled by a single flow of heat transfer medium. While the separate flows of heat transfer medium have been shown to enter flow channels 86 and 92 and exit through flow channels 90 and 96, respectively, the separate flows may instead be directed to flow in the opposite direction.

While the above detailed embodiments have described active cooling provided by a flow of heat transfer medium through both inner conducting member 4 and connectors 8 and 10, the current disclosure is not limited in this manner. In some embodiments only inner conducting member 4 may be actively cooled. In such an arrangement a flow of cooling medium may flow up to, but not through, the connectors. Flow the heat transfer medium near the connectors may still cool the connectors, but not as much as in the arrangements discussed above where it flows through the connectors. The flow of heat transfer medium may exit the cable assembly within one inch, two inches, three inches, or any appropriate distance from the connector provided the connectors are cooled a sufficient amount to permit the desired current to pass through the electrical connection.

Figure 15:
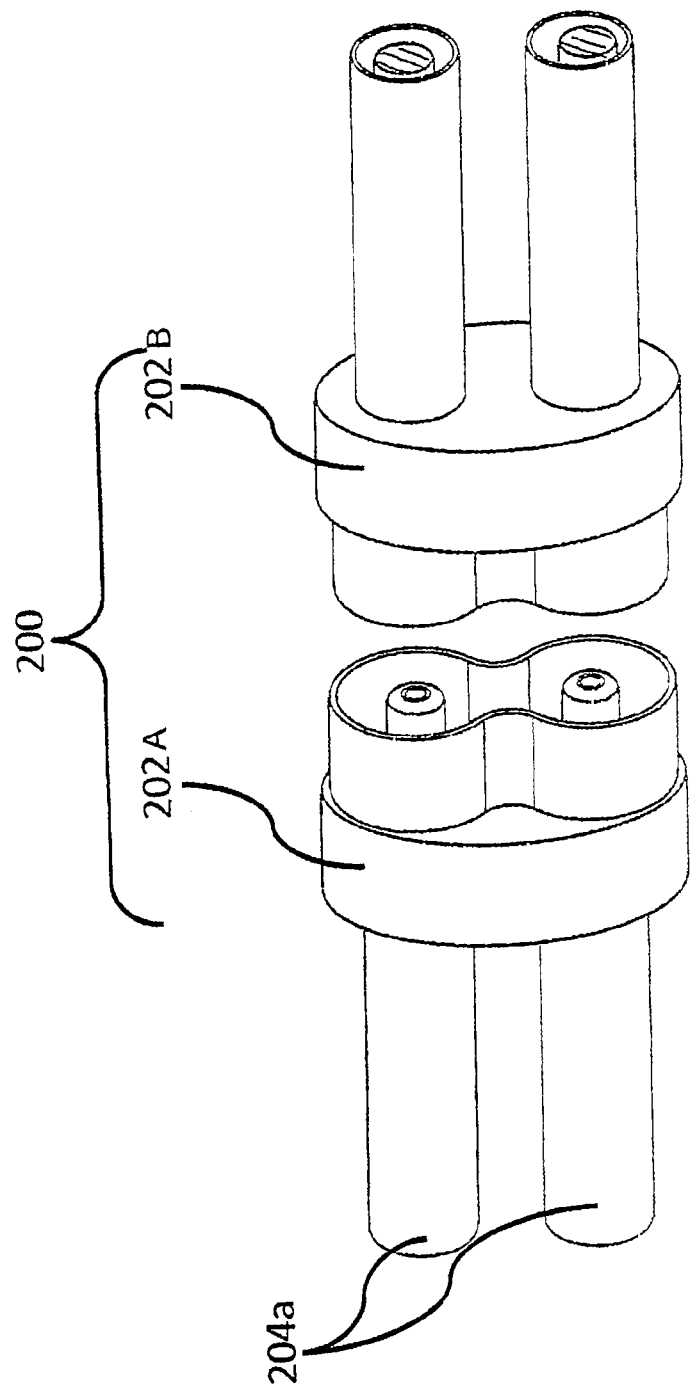
FIG. 15 is a schematic perspective view of an electrical connector block implementing active cooling of the electrical connection.

In some embodiments, it may be advantageous to incorporate the above disclosed actively cooled electrical connections into an electrical connector block. An electrical connector block housing 200, as shown in FIG. 15, may include two mating halves 202A and 202B incorporating a plurality of actively cooled connectors 204b and associated plurality of actively cooled electrical conductor assemblies 204a. Each mating half 202A and 202B may include one or more connectors 204b disposed therein that are adapted to mate with a corresponding connector 204b on the opposing mating half. Each housing may include all male, all female, or a mixture of male and female connectors.

In some embodiments, the electrical connector block housing may further include active cooling from a flow of heat transfer medium. The housing 200 may be provided with a flow of heat transfer medium through a separate flow inlet or an inlet arranged and adapted to redirect a portion of a flow of heat transfer medium provided by one of the plurality of connectors 204b disposed in the connector block and attached to a corresponding actively cooled electrical conductor assembly 204a. In either case a flow of heat transfer medium may be provided to at least one flow channel disposed within the housing of connector block 200 which may be adapted to direct a flow of heat transfer medium through housing 200. While the actively cooled electrical block has been disclosed for use with actively cooled electrical connectors, it would be obvious to one of skill in the art that the actively cooled electrical block may be used with any type of cable, including a passively cooled cable, as long as the block is provided with a cooling flow of heat transfer medium through an appropriately configured and attached source of heat transfer medium.

Figure 16:
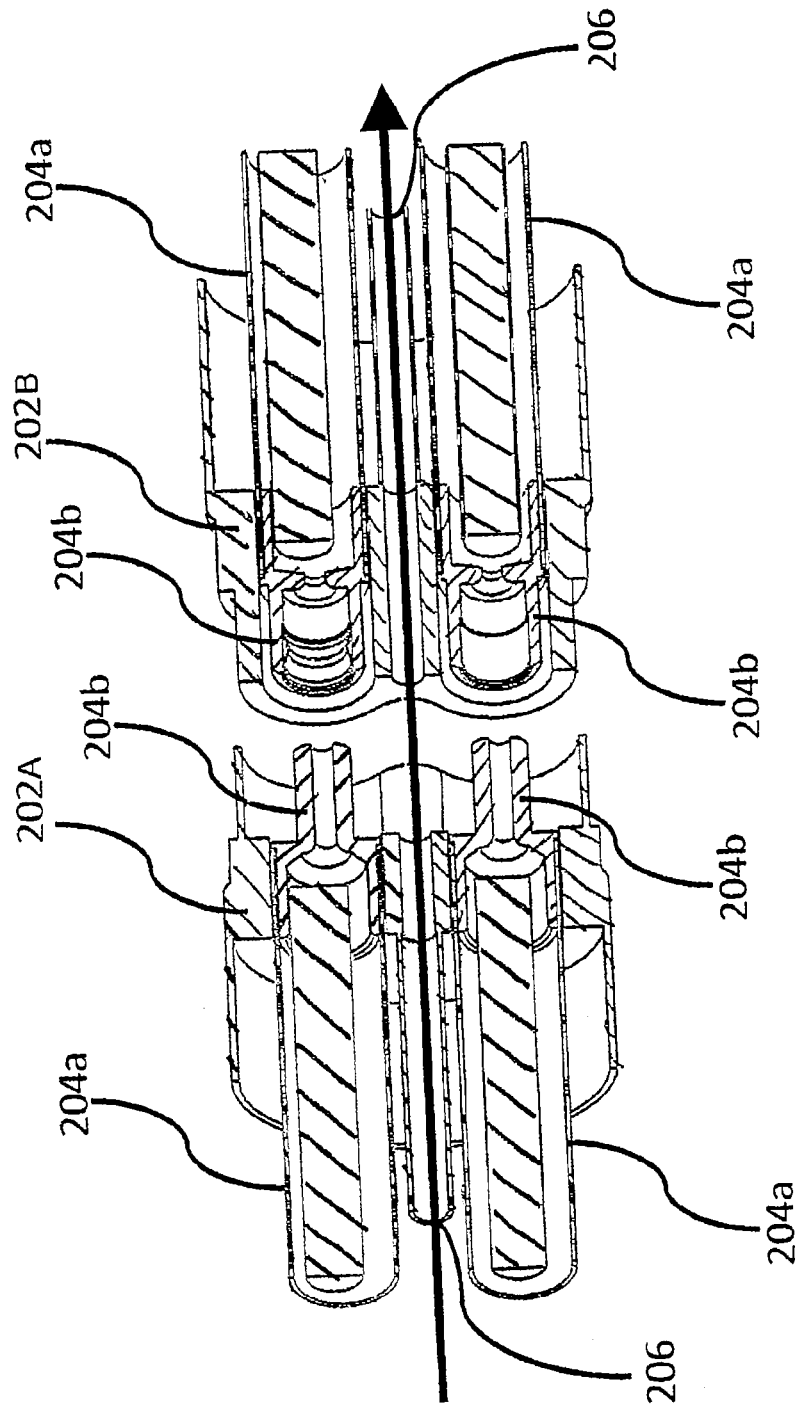
FIG. 16 is a schematic cross-sectional view of an electrical connector block with an integrally formed flow path for active cooling of the block.

In one arrangement, as depicted in FIG. 16, a flow of heat transfer medium, as indicated by the arrow, flows through a flow channel 206 integrally formed in mating halves 202A and 202B, as for example, during a plastic molding process. Alternatively, flow channel 206 may be a separately formed component that is integrated into housing 200 using a mechanical attachment, adhesive, fastener, weld, or other appropriate attachment means. In the current arrangement, the flow of heat transfer medium flows through housing 200 without directly contacting the connectors 204b or electrical conductor assemblies 204a. Consequently, heat may be directly transferred from housing 200 to the flow of heat transfer medium, and indirectly from the connectors 204b and the electrical conductor assemblies 204a to the flow of heat transfer medium. In addition to the above, the heat transfer medium may be used downstream of connector 200 to cool conductor assemblies 204a, or other heat generating components such as a charging battery or relay. Without wishing to be bound by theory, partially insulating a portion of the flow of heat transfer medium from conductor assemblies 204a, for use by the downstream components, may enable a greater amount of downstream cooling due to reduced upstream heating of the flow. The above arrangement may also provide a reduced thermal gradient across conductor assemblies 204a.

Figure 17:
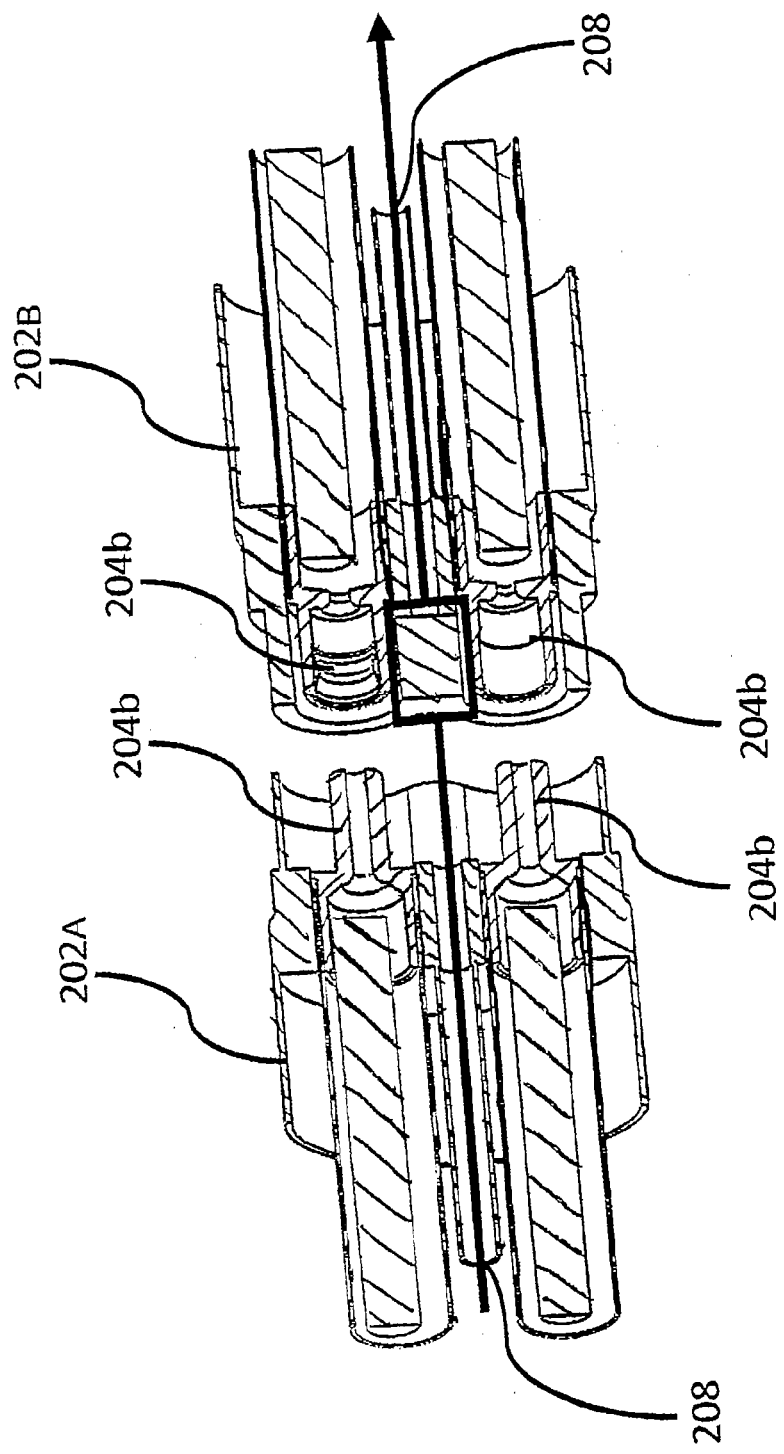
FIG. 17 is a schematic cross-sectional view of a disassembled electrical connector block with an integrally formed flow path for active cooling of the block and connectors.
Figure 18:
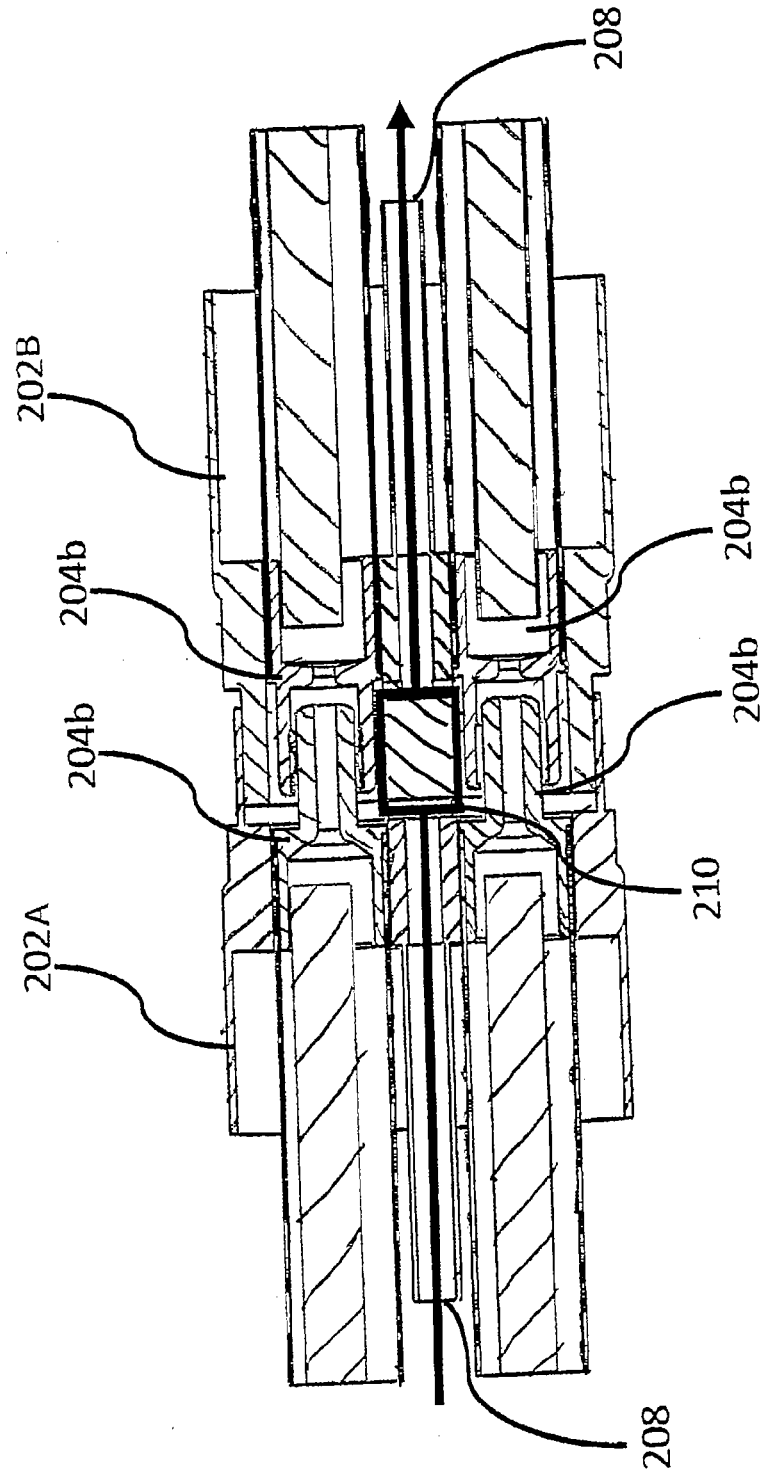
FIG. 18 is a schematic cross-sectional view of an assembled electrical connector block with an integrally formed flow path for active cooling of the block and connectors.

In another arrangement, a flow of heat transfer medium, as indicated by the arrow, flows through a flow channel 208 integrally formed in mating halves 202A and 202B, as depicted in FIGS. 17 and 18. FIGS. 17 and 18 depict disassembled and assembled electrical connector blocks respectively. In contrast to the arrangement described above in regards to FIG. 16, the flow of heat transfer medium may flow through housing 200 which may include a gap 210 located between the two mating halves 202A and 202B. Gap 210, or an equivalent structure, may redirect the flow of heat transfer medium so that it directly contacts the connectors 204b and/or electrical conductor assemblies 204a. Consequently, heat may be directly transferred from housing 200, the electrical conductor assemblies 204a, and/or the connectors 204b to the flow of heat transfer medium.

Figure 19:
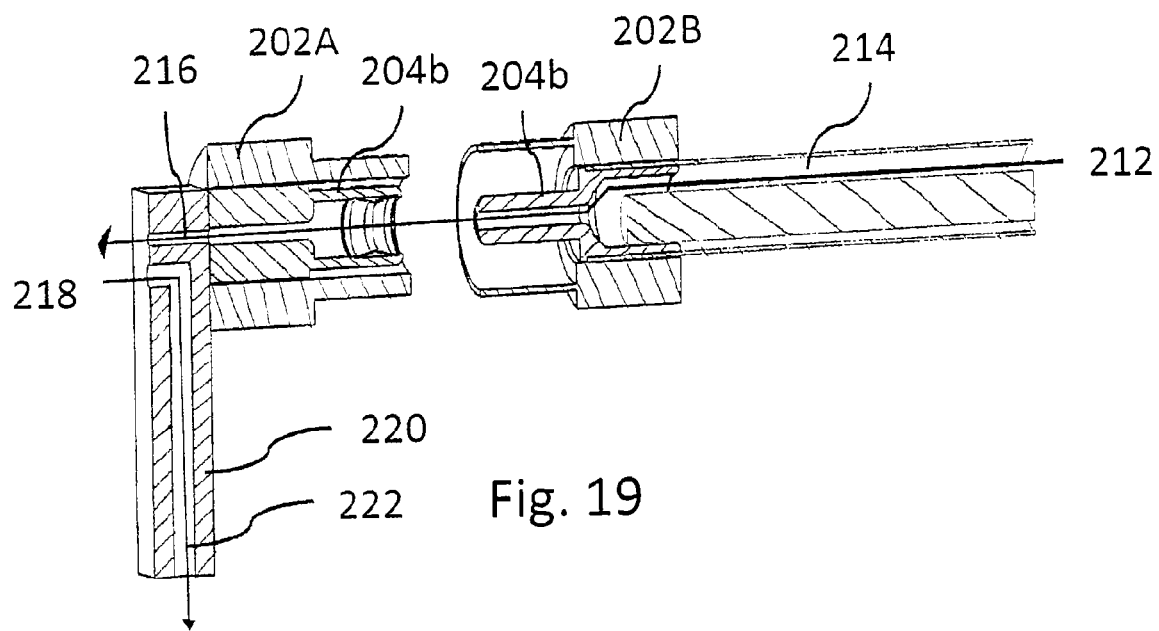
FIG. 19 is a schematic perspective cross-sectional view of a buss bar connection implementing two forms of active cooling.
Figure 20:
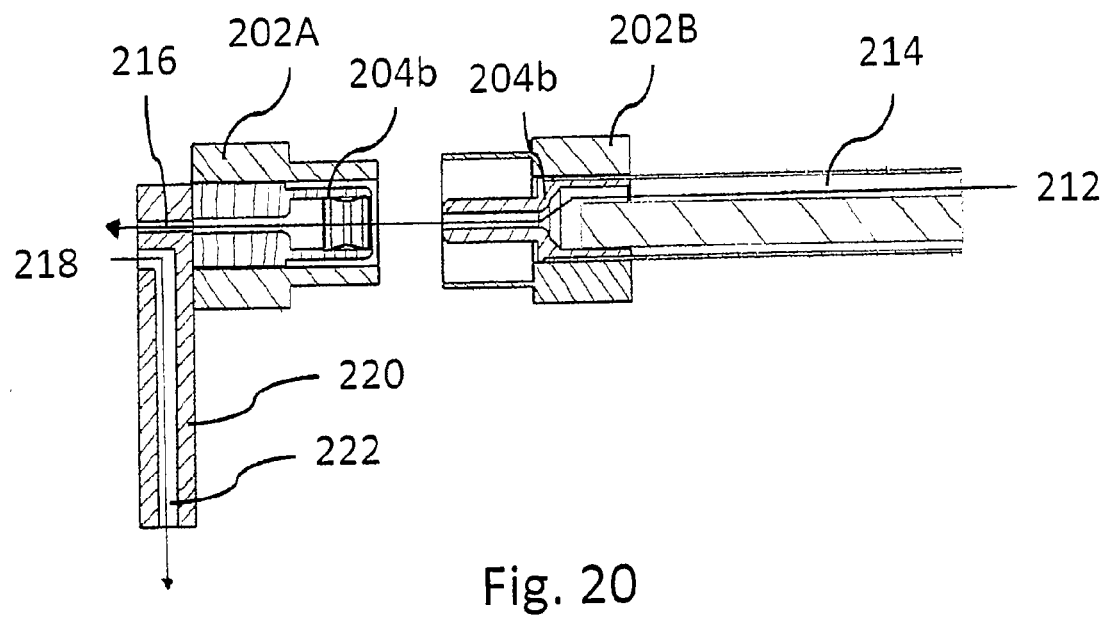
FIG. 20 is a schematic cross-sectional view of a buss bar connection implementing two forms of active cooling.
Figure 21:
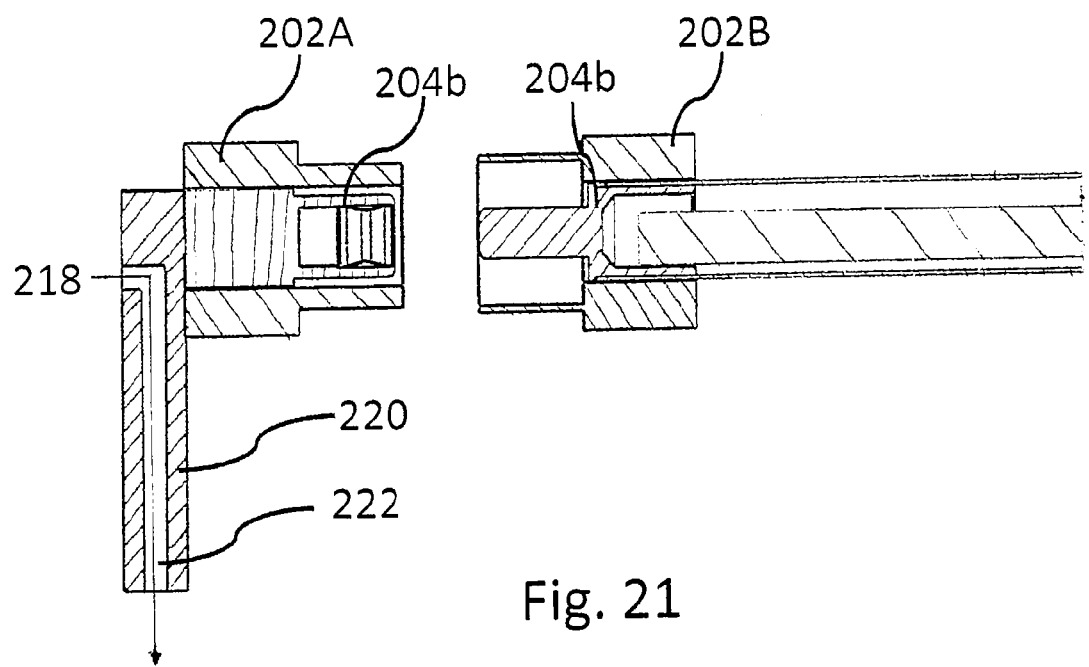
FIG. 21 is a schematic cross-sectional view of a buss bar connection implementing active cooling of the buss bar.

FIGS. 19, 20, and 21 depict different forms of active cooling. The depicted electrical connection includes an electrical connection block with mating halves 202A and 202B including matching connectors 204b. Similar to the embodiments described above, a flow of heat transfer medium 212 may actively cool the system by flowing through flow channels 214 and 216, which are in selective fluid communication with one another. As an alternative, or in addition, to the flow through active cooling of flow 212, a flow of heat transfer medium 218, may be provided to electrical conductor assembly 220 via flow channel 222. Electrical conductor assembly 220 may be a buss bar. In this embodiment, flow channel 222 does not pass through the connector. Instead flow channel 222, is routed sufficiently close to the connector to permit efficient active cooling of both the connector and electrical conductor assembly and permit a current greater than a rated current capacity of at least the connector to pass through the electrical conductor assembly and connector. In such an arrangement, the connector is indirectly cooled by heat transfer through the electrical conductor assembly to the flow of heat transfer medium. In some instances, the flow of heat transfer medium may enter the electrical conductor assembly substantially adjacent to the attached connector to further enhance the amount of cooling provided to the connector. Without wishing to be bound by theory, the connector may be cooled to a greater degree when the entrance, and/or flow channel, of the flow of heat transfer medium is arranged closer to the attached connector. This may be due to a reduced thermal conduction length through the electrical conductor assembly and/or cooler heat transfer medium being present at upstream portions as compared to warmer downstream portions. An embodiment showing both cooling methods is depicted in FIGS. 19 and 20. FIG. 21 depicts another embodiment with a flow of heat transfer medium directed only through the electrical conductor assembly (i.e. no flow through the connectors) with indirect cooling of the attached connector. As stated above, the flows of heat transfer medium may be a gas or liquid. Since the current embodiment includes an electrical connection block, active cooling may also be provided to the electrical connection block itself as detailed above, not depicted.

Figure 22:
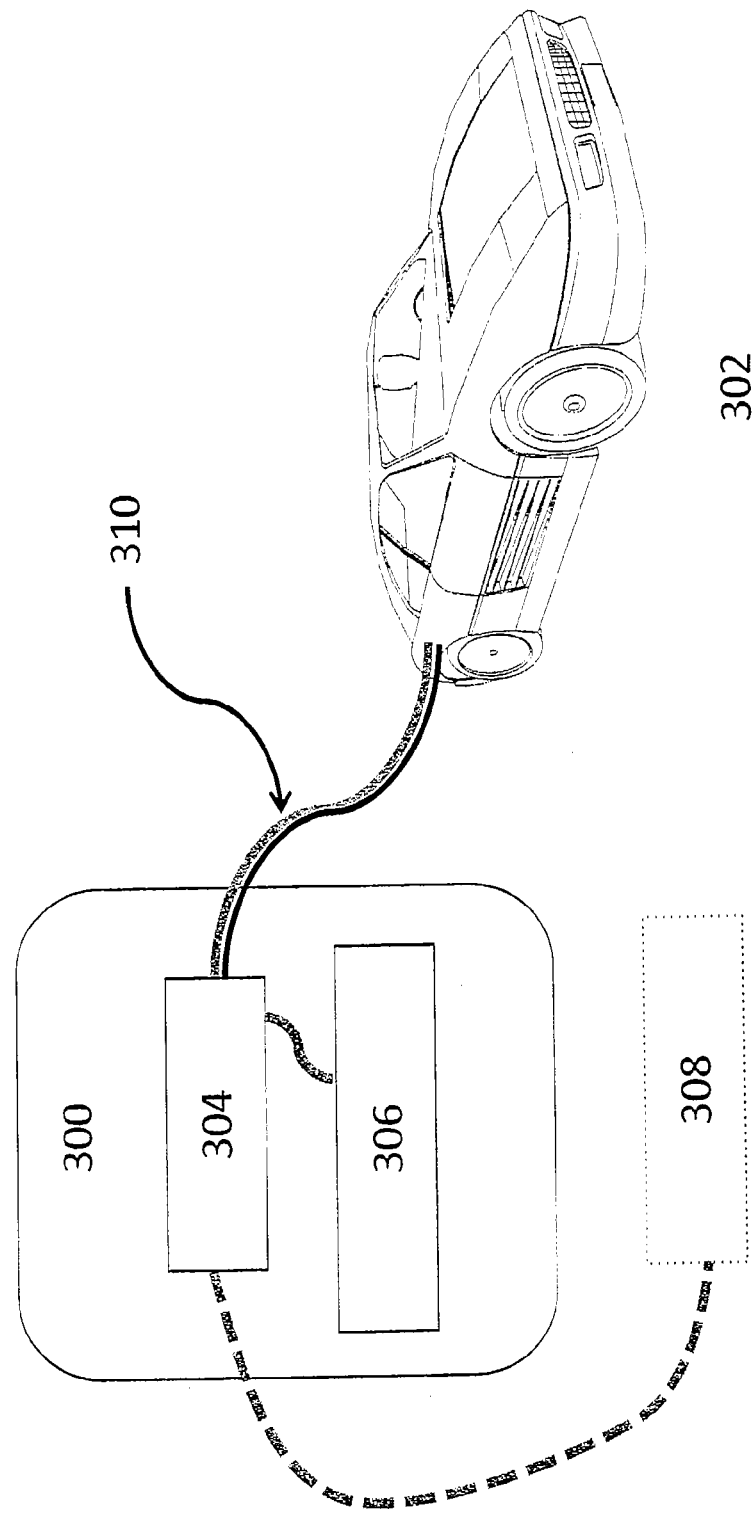
FIG. 22 is a schematic representation of a rechargeable device utilizing the actively cooled electrical connection system.

The above described actively cooled electrical connections and actively cooled electrical connector blocks may be used in any number of applications requiring either cooling, reduction in size, or reduction in weight of the conducting elements. However the actively cooled electrical systems and connector blocks are especially suited for integration with a charger 300 for charging any device having a rechargeable battery, especially one where rapid charging is desired. In one embodiment, the rechargeable device may be an electric vehicle 302, as depicted in FIG. 22, though other suitable devices are contemplated as indicated above. In some instances charger 300 may be a quick charger capable of charging an electric vehicle battery within 10 seconds, 30 seconds, 1 minute, 2 minutes, 5 minutes, 15 minutes, 30 minutes, or 60 minutes. Charger 300 may include a power supply 304 capable of delivering a 360 C, 120 C, 60 C, 30 C, 12 C, 4 C, 2 C, or 1 C charge rate to a vehicle battery. Charger 300 may also include an integral active cooling system 306, or a separate external active cooling system 308. The power supply 304 and active cooling system 306 or 308 may be connected to an actively cooled electrical connection 310 through which electrical power, and optionally heat transfer medium, may be transferred to electric vehicle 302. Active cooling system 306 or 308 may provide a flow of heat transfer medium at a controllable temperature, pressure, and flow rate to the actively cooled electrical connection 310. As detailed above, the flow of heat transfer medium may be used to cool actively cooled electrical connection 310. Active cooling system 306 or 308 may include a controller adapted to control the temperature, pressure, and/or flow rate of the heat transfer medium based on a sensed parameter such as temperature, pressure, flow rate, or current. Sensors to monitor the above noted parameters may be located in, or between, the charger 300, power supply 302, active cooling system 306 or 308, actively cooled electrical connection 310, or electric vehicle 302.

Figure 23:
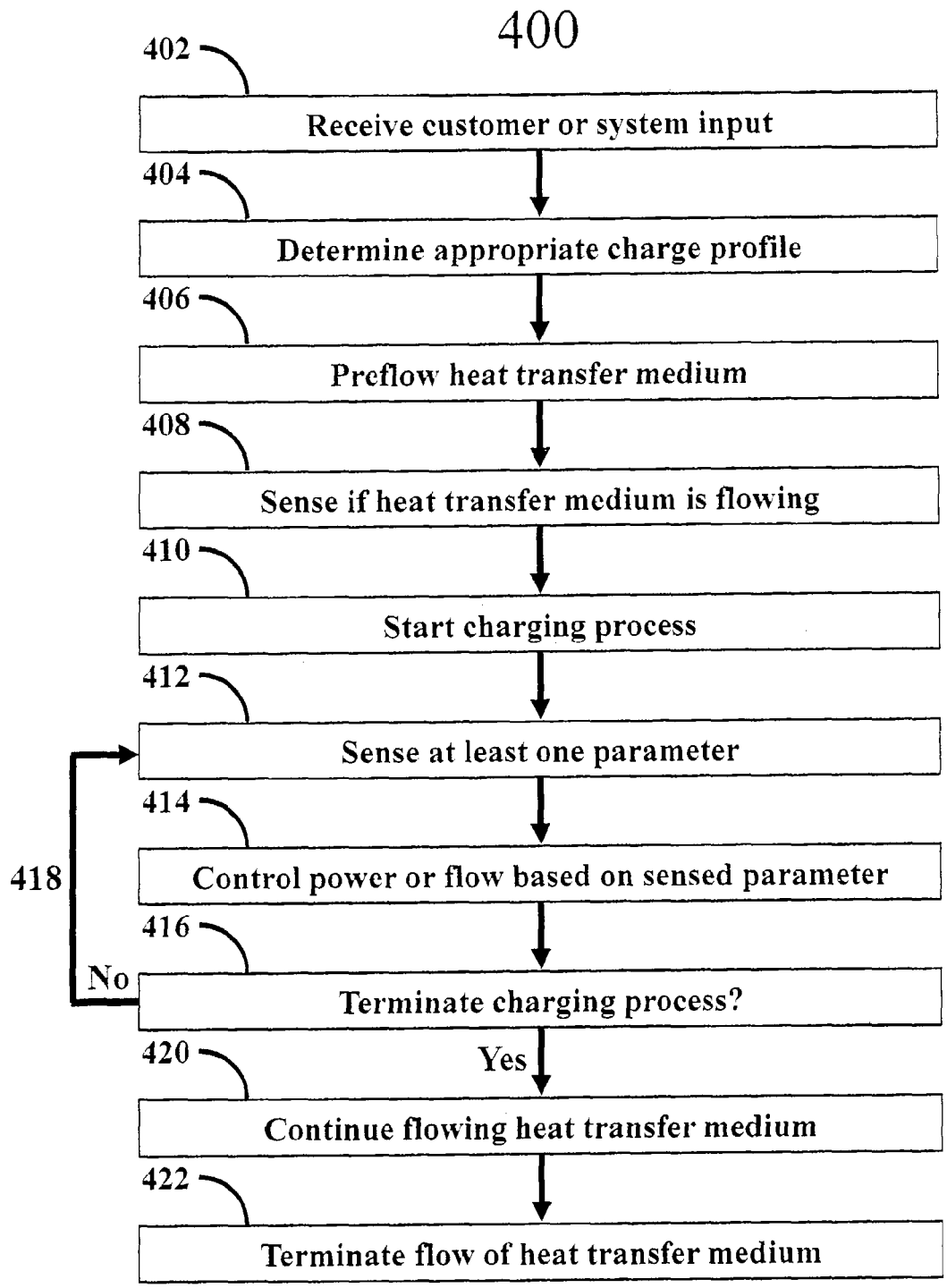
FIG. 23 is flow diagram of exemplary steps that may be implemented during a charging process.
Figure 24:
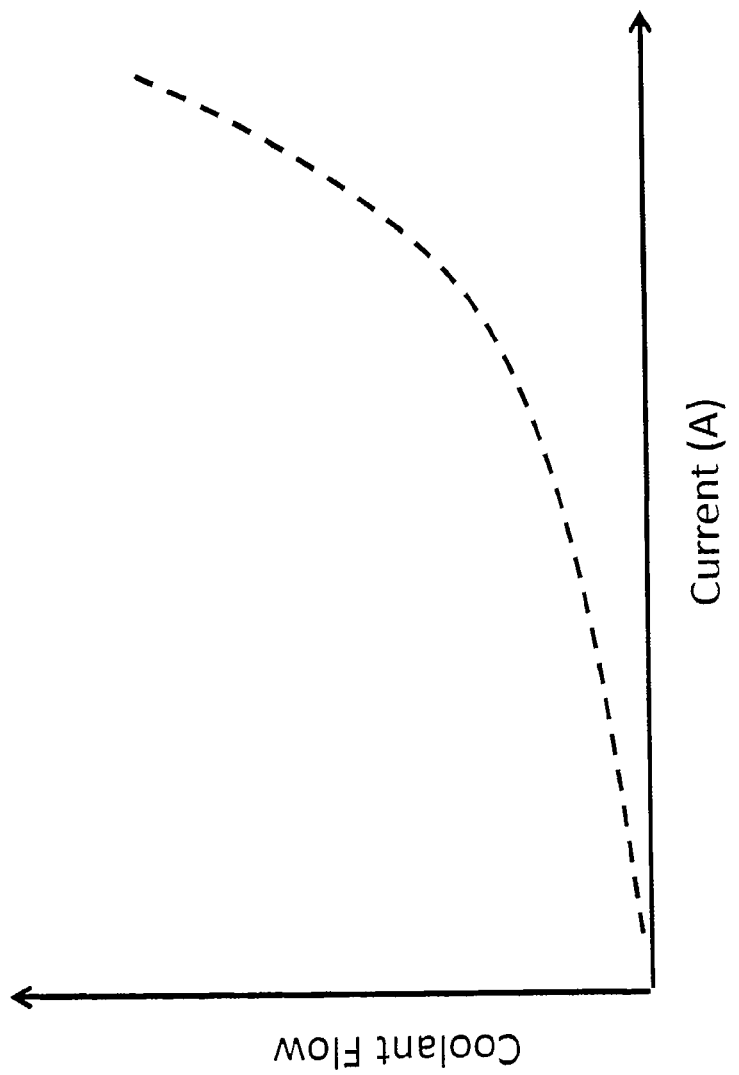
FIG. 24 is a qualitative graph comparing coolant flow versus current.

In one embodiment, charger 300 may implement charging protocol 400 depicted in FIG. 23. When a system, such as electric vehicle 302, is connected to charger 300 the following steps may be implemented. In step 402 the charger may receive input from the customer or connected system indicating the charge requirements of the connected system. The input may include a battery capacity, state of charge (SOC), charge rate, requested charge profile, or other appropriate parameter for charging a system. In step 404 the charger may determine an appropriate charge profile based on the received input. The charger may then preflow heat transfer medium through the actively cooled electrical connection in step 406 prior to passing current. The charger may actively monitor the flow rate of heat transfer medium during step 408 to ensure there is no blockage or break in the lines during preflow step 406. If the charger senses a blockage or break in the lines it may terminate the charging process. Alternatively, when a blockage or break in the lines is detected, the charger may continue charging at a much lower charging rate corresponding to the rated capacity of each of the cables and connectors without active cooling. After performing steps 406 and 408, the charger may start the charging process at step 410. During charging, the charger may actively sense at least one parameter in step 412. The at least one parameter may include a temperature of the conductor, a temperature of the connector, the current, a temperature of the flow, the flow rate of the flow, a temperature of a connected system, and/or a state of charge of a connected battery. Based on the at least one sensed parameter, the controller may actively control the power or flow of heat transfer medium during step 414. In one embodiment, the controller may control the current, a temperature of the flow, a pressure of the flow, and/or a flow rate of the flow. In one embodiment, the controller may increase the flow rate of the heat transfer medium in response to an increase in the current as qualitatively indicated in FIG. 24. If a blockage, break in the line, leak, threshold temperature, threshold current, threshold pressure, or other safety hazard is indicated by the at least one sensed parameter the charger may terminate the charging process. Alternatively, depending upon the nature of the system failure, when a blockage, break in the line, leak, threshold temperature, threshold current, threshold pressure, or other safety hazard is is detected, the charger may instead continue charging at a much lower charging rate corresponding to the rated capacity of each of the cables and connectors without active cooling. Upon terminating the charging process at step 416, either in response to a user input, SOC of the system, or a detected safety hazard, the charger stops passing current to the connected system. The charger may repeatedly perform steps 412, 414 and 416 during the charging process as indicated by loop 418. The charger may continue to flow heat transfer medium during step 420 to further cool the actively cooled electrical connection and/or act as a safety mechanism to ensure that current is not passed through the actively cooled electrical connection without a flow of heat transfer medium actively flowing. The flow of heat transfer medium may terminate after a preselected time delay, or it may terminate upon disconnection of the system from the charger. The order in which the above steps are presented should not be construed to limit the order in which the steps may be performed. Furthermore, it is possible in some embodiments, that the order in which the steps are performed is different than that which is currently presented. Furthermore, some steps may be omitted, or new steps may be included. The current disclosure is not limited in this manner.

While the present teachings have been described in conjunction with various embodiments and examples, it is not intended that the present teachings be limited to such embodiments or examples. On the contrary, the present teachings encompass various alternatives, modifications, and equivalents, as will be appreciated by those of skill in the art. Accordingly, the foregoing description and drawings are by way of example only.

What is claimed is:

1. A method for providing electrical power comprising:
    providing an electrical connector connected to an electrical conductor assembly;
    actively cooling the electrical connector and electrical conductor assembly with a flow of heat transfer medium flowing substantially along a length of the electrical conductor assembly and through the electrical connector; and actively passing a desired current through the electrical conductor assembly and electrical connector, wherein the current is greater than a rated current capacity of at least the electrical connector without active cooling.

2. The method of claim 1 further comprising passing a current through the electrical conductor assembly and electrical connector, wherein the current is greater than a rated current capacity of the electrical conductor assembly.

3. The method of claim 1 further comprising sensing at least one parameter and controlling at least one of the current, a temperature of the flow, a pressure of the flow, sources of additional flow, ejection of the flow along a length of the electrical conductor assembly, and a flow rate of the flow based on the at least one parameter.

4. The method of claim 3 wherein the at least one parameter includes at least one of a temperature of the conductor, a temperature of the connector, the current, a temperature of the flow, the flow rate of the flow, a temperature of a connected system, and a state of charge of a connected battery.

5. The method of claim 1, wherein the flow is pressurized relative to atmospheric pressure.

6. The method of claim 1, wherein the flow comprises air.

7. The method of claim 1, wherein the flow comprises an inert gas.

8. The method of claim 1, wherein the flow comprises a fluid.

9. The method of claim 1 further comprising cooling a battery electrically connected to the electrical conductor assembly and electrical connector with at least a portion of the flow.

10. The method of claim 1 further comprising, prior to passing a current, preflowing the heat transfer medium.

11. The method of claim 1 further comprising cooling substantially an entire conducting path electrically connected to the connector and conductor with at least a portion of the flow of heat transfer medium.

12. The method of claim 11, wherein cooling substantially the entire conducting path includes cooling at least one relay.

13. An actively cooled electrical connection comprising:
    a first electrical conductor assembly having a first conductor assembly flow channel;
    a second electrical conductor assembly having a second conductor assembly flow channel;
    a first electrical connector attached to the first conductor assembly, wherein the first electrical connector includes a first connector flow channel in fluid communication with the first conductor assembly flow channel; and
    a second electrical connector attached to the second conductor assembly and selectively connectable to the first connector, wherein the second electrical connector includes a second connector flow channel in fluid communication with the second conductor assembly flow channel, wherein the first and second connector flow channels are adapted to direct at least one flow of heat transfer medium through the first and second conductor assembly flow channels and through the first and second connectors, wherein at least a portion of the at least one flow of heat transfer medium is directed towards a separable interface between the first electrical connector and the second electrical connector.

14. The actively cooled electrical connection of claim 13, wherein each conductor assembly further comprises an outer insulating member and at least one inner conducting member disposed within the outer insulating member.

15. The actively cooled electrical connection of claim 14, wherein at least one of the conductor assembly flow channels is disposed within the at least one inner conducting member.

16. The actively cooled electrical connection of claim 14, wherein at least a portion of the outer insulating member is spaced from the at least one inner conducting member to thereby define at least one of the conductor flow channels.

17. The actively cooled electrical connection of claim 16, wherein at least one of the conductor flow channels is integrally formed in at least one of the outer insulating member and at least one inner conducting member.

18. The actively cooled electrical connection of claim 14, wherein each inner conducting member comprises a first and second portion, wherein the first portion is insulated to a greater extent than the second portion.

19. The actively cooled electrical connection of claim 14, further comprising a shielding layer disposed on the at least one inner conducting member.

20. The actively cooled electrical connection of claim 14, wherein a cross sectional area of the at least one inner conducting member varies along its length.

21. The actively cooled electrical connection of claim 13, wherein a cross sectional area of at least one of the conductor assembly flow channels varies along its length.

22. The actively cooled electrical connection of claim 13 in combination with a source of heat transfer medium, wherein the source of heat transfer medium is adapted to provide the at least one flow or heat transfer medium at a pressure greater than atmospheric pressure.

23. The actively cooled electrical connection of claim 13 in combination with a source of heat transfer medium, wherein the heat transfer medium is air.

24. The actively cooled electrical connection of claim 13 in combination with a source of heat transfer medium, wherein the heat transfer medium is an inert gas.

25. The actively cooled electrical connection of claim 13 in combination with a source of heat transfer medium, wherein the heat transfer medium is a fluid.

26. The actively cooled electrical connection of claim 13, wherein the first conductor assembly and first connector are in fluid communication with the second conductor assembly and second connector.

27. The actively cooled electrical connection of claim 13, wherein at least one of the first and second conductor assembly flow channels is adapted to direct the at least one flow in a first direction and in a second direction substantially opposite the first direction.

28. The actively cooled electrical connection of claim 13, wherein the first and second conductor assembly flow channels are adapted to direct the at least one flow from the first conductor assembly to the second conductor assembly and back to the first conductor assembly.

29. The actively cooled electrical connection of claim 13, wherein the at least one flow of heat transfer medium comprises a first flow and a separate second flow, and wherein the first conductor assembly and first connector are adapted to be in fluid communication with the first flow and the second conductor assembly and second connector are adapted to be in fluid communication with the separate second flow.

30. The actively cooled electrical connection of claim 13, wherein the at least one flow comprises a first flow and a separate second flow, wherein the first conductor assembly flow channel is adapted to direct the first flow from the first conductor assembly to the second conductor assembly, and wherein the second conductor assembly flow channel is adapted to direct the separate second flow from the second conductor assembly to the first conductor assembly.

31. The actively cooled electrical connection of claim 13, wherein at least one of the first and second connectors includes an inlet adapted to be in fluid communication with the at least one flow, wherein the first and second connectors are adapted to direct the at least one flow from the inlet to the first and second conductor assembly flow channels.

32. A method for providing electrical power comprising:
providing an electrical connector connected to an electrical conductor assembly;
actively cooling the electrical conductor assembly with a flow of heat transfer medium flowing substantially along a length of the electrical conductor assembly; and
actively passing a desired current through the electrical conductor assembly and electrical connector, wherein the current is greater than a rated current capacity of at least the electrical connector without active cooling.

33. A actively cooled electrical connection comprising:
a first electrical conductor assembly;
a first electrical connector including a first mating surface extending along a longitudinal direction of the first electrical connector, wherein the first electrical connector is attached to the first electrical conductor assembly; and
a second electrical connector including a second mating surface extending along a longitudinal direction of the second electrical connector, wherein one of the first and second mating surfaces includes a plurality of compliant electrical contacts adapted to selectively connect the first and second electrical connectors, and wherein the first conductor assembly and the first and second electrical connector are adapted to direct at least one flow of heat transfer medium through the first conductor assembly and the first and second connectors, wherein at least a portion of the at least one flow of heat transfer medium is directed towards the plurality of compliant electrical contacts located at a separable interface between the first electrical connector and the second electrical connector.

34. The actively cooled electrical connection of claim 33 further comprising a second electrical conductor assembly and a third electrical connector attached to the second electrical conductor assembly.

35. The actively cooled electrical connection of claim 34 further comprising a housing, wherein the first and third connectors are disposed in a housing.

36. The actively cooled electrical connection of claim 34, wherein the first and third connectors are both male or female.

37. The actively cooled electrical connection of claim 34, wherein at least one of the first and third connectors is male and at least one of the first and third connectors is female.

38. The actively cooled electrical connection of claim 33 in combination with a source of heat transfer medium, wherein the heat transfer medium is air.

39. The actively cooled electrical connection of claim 33 in combination with a source of heat transfer medium, wherein the heat transfer medium is an inert gas.

40. The actively cooled electrical connection of claim 33 in combination with a source of heat transfer medium, wherein the heat transfer medium is a fluid.

41. An electrical connector block comprising: a housing;
at least one electrical connector disposed in the housing;
at least one heat transfer medium inlet disposed in the housing; and
at least one connector block flow channel disposed in the housing in fluid communication with the at least one inlet and adapted to direct a flow of heat transfer medium through the housing, wherein at least a portion of the flow of heat transfer medium is directed towards a separable interface between the at least one electrical connector and at least one mating electrical connector when the at least one electrical connector and the mating electrical connector are connected.

42. The electrical connector block of claim 41, wherein at least one electrical connector includes a connector flow channel in fluid communication with the at least one inlet.

43. The electrical connector block of claim 41, wherein the at least one connector block flow channel comprises a gap between mating halves of the housing.

44. The electrical connector block of claim 41, wherein the at least one connector block flow channel is integrally formed in the housing.

45. The electrical connector block of claim 41, wherein the at least one connector block flow channel is adapted to direct the flow of heat transfer medium into direct contact with the at least one electrical connector.

46. The method of claim 32 further comprising actively cooling the electrical connector with a flow of heat transfer medium flowing through the electrical connector.

47. The method of claim 32, wherein the step of actively cooling further comprising actively cooling the electrical conductor assembly with a flow of liquid.

48. The method of claim 32, wherein the step of actively cooling further comprising actively cooling the electrical conductor assembly with a flow of air.

49. The method of claim 32 further comprising passing a current through the electrical conductor assembly and electrical connector, wherein the current is greater than a rated current capacity of the electrical conductor assembly.

50. The method of claim 32, further comprising indirectly cooling the electrical connector with the flow of heat transfer medium flowing through the electrical conductor assembly.

51. The method of claim 46, wherein the flow flowing through the electrical conductor assembly and the flow flowing through the electrical connector are separate flows.

* * * * *